(12) United States Patent
Beidas

(10) Patent No.: US 10,999,048 B1
(45) Date of Patent: May 4, 2021

(54) SUPERIOR TIMING SYNCHRONIZATION USING HIGH-ORDER TRACKING LOOPS

(71) Applicant: HUGHES NETWORK SYSTEMS, LLC, Germantown, MD (US)

(72) Inventor: Bassel F. Beidas, Germantown, MD (US)

(73) Assignee: HUGHES NETWORK SYSTEMS, LLC, Germantown, MD (US)

( * ) Notice: Subject to any disclaimer, the term of this patent is extended or adjusted under 35 U.S.C. 154(b) by 0 days.

(21) Appl. No.: 16/732,007

(22) Filed: Dec. 31, 2019

(51) Int. Cl.
*H04L 7/00* (2006.01)

(52) U.S. Cl.
CPC .......... *H04L 7/0029* (2013.01); *H04L 7/0079* (2013.01)

(58) Field of Classification Search
CPC ............................ H04L 7/0029; H04L 7/0079
See application file for complete search history.

(56) References Cited

U.S. PATENT DOCUMENTS

| | | | | |
|---|---|---|---|---|
| 6,067,319 A | * | 5/2000 | Copeland | H04L 25/03057 370/350 |
| 2004/0120387 A1 | * | 6/2004 | Bultan | H04L 7/0029 375/149 |
| 2013/0058391 A1 | * | 3/2013 | Hou | H04L 7/0058 375/232 |
| 2013/0315346 A1 | * | 11/2013 | Varma | H04L 27/2338 375/316 |
| 2017/0127206 A1 | * | 5/2017 | Skovenborg | H04R 29/007 |
| 2018/0115390 A1 | * | 4/2018 | Beidas | H04B 7/18513 |
| 2018/0270574 A1 | * | 9/2018 | Trammel | H04R 3/04 |
| 2019/0140676 A1 | * | 5/2019 | Chen | G06F 1/04 |

OTHER PUBLICATIONS

Erup et al., "Interpolation in digital modems—Part II: Implementation and performance," in IEEE Transactions on Communications, vol. 41, No. 6, Jun. 1993, pp. 998-1008.
Gardner, Floyd M., "A BPSK/QPSK Timing-Error Detector for Sampled Receivers," in IEEE Transactions on Communications, vol. 34, No. 5, May 1986, pp. 423-429.

* cited by examiner

*Primary Examiner* — Jaison Joseph
(74) *Attorney, Agent, or Firm* — Sheppard, Mullin, Richter & Hampton LLP

(57) ABSTRACT

Some implementations of the disclosure are directed to symbol-timing tracking systems and methods. A symbol-timing tracking system may include: an ADC to generate a digital signal by sampling an analog signal received at a receiver; an interpolator to adjust a sampling rate of the digital signal; a receive filter to apply a receive filtering function to the digital signal to generate a filtered signal; a timing error detector configured to generate a timing error signal from the filtered signal; a high-order loop filter to filter the timing error signal to generate a filtered timing error signal; and a numerically controlled oscillator to control timing data based on the filtered timing error signal and provide the timing data to the interpolator, wherein the interpolator is to correct for timing of the digital signal and adjust the sampling rate of the digital signal based on the timing data.

20 Claims, 19 Drawing Sheets

SUPERIOR TIMING SYNCHRONIZATION USING HIGH-ORDER TRACKING LOOPS

BACKGROUND

Timing synchronization is a fundamental operation of communications systems. It may be needed for performing many receive functions, including carrier phase tracking, frequency tracking, and successful data recovery.

SUMMARY

Some implementations of the disclosure are directed to symbol-timing tracking systems and methods.

In one embodiment, a symbol-timing tracking system for a receiver, comprises: an analog-to-digital converter (ADC) configured to generate a digital signal by sampling an analog signal received at the receiver; an interpolator configured to adjust a sampling rate of the digital signal; a receive filter configured to apply a receive filtering function to the digital signal to generate a filtered signal; a timing error detector (TED) configured to generate a timing error signal from the filtered signal; a high-order loop filter configured to filter the timing error signal to generate a filtered timing error signal; and a numerically controlled oscillator (NCO) configured to control timing data based on the filtered timing error signal and provide the timing data to the interpolator, wherein the interpolator is configured to correct for timing of the digital signal based on the timing data, and adjust the sampling rate of the digital signal based on the timing data. In some implementations, the TED is nonlinear, and the high-order loop filter is configured to filter out self-noise generated by the TED due to its nonlinearity.

In some implementations, the TED is not data-aided, a carrier phase offset of the analog signal is unknown by the TED, and the analog signal is shifted in time by an amount unknown by the TED.

In some implementations, the high-order loop filter is configured to track higher order dynamics of a timing signal. The higher order dynamics may comprise a clock timing-ramp or a clock frequency-ramp.

In some implementations, the analog signal comprises complex-valued symbols drawn from a 32 APSK constellation, a 64 APSK constellation, a 128 APSK constellation, or a 256 APSK constellation. The analog signal may be shaped by a root raised-cosine (RRC) transmit filter, and the receive filter may be matched to the RRC transmit filter.

In some implementations, the high-order loop filter is an infinite impulse response (IIR) filter. An output v[n] of the IIR filter may be given by:

$$v[n] = \sum_{k=0}^{N_\beta} \beta_k \cdot u[n-k] - \sum_{k=1}^{N_\alpha} \alpha_k \cdot v[n-k],$$

where $N_\alpha$ and $N_\beta$ are orders of feedback and feedforward filtering operations of the IIR filter, respectively, $\alpha_k$ and $\beta_k$ are constants, and u[n] is an input of the IIR filter.

In some implementations, the IIR filter is configured with a loop of third-order or fourth-order.

In one embodiment, a method comprises: sampling an analog signal received at a receiver to generate a digital signal; adjusting, using an interpolator, a sampling rate of the digital signal; applying a receive filtering function to the digital signal to generate a filtered signal; generating, using a timing error detector (TED), a timing error signal from the filtered signal; filtering, using a high-order loop filter, the timing error signal to generate a filtered timing error signal; controlling, using a numerically controlled oscillator (NCO), timing data based on the filtered timing error signal; and providing the timing data to the interpolator, wherein the interpolator is configured to correct for timing of the digital signal based on the timing data, and adjust the sampling rate of the digital signal based on the timing data. In some implementations, the TED is nonlinear, and filtering the timing error signal comprises filtering self-noise generated by the TED due to its nonlinearity.

In one embodiment, a receiver comprises: circuitry configured to receive an analog signal from a wireless communication network; and a symbol-timing tracking system, comprising: an analog-to-digital converter (ADC) configured to generate a digital signal by sampling the analog signal; an interpolator configured to adjust a sampling rate of the digital signal; a receive filter configured to apply a receive filtering function to the digital signal to generate a filtered signal; a timing error detector (TED) configured to generate a timing error signal from the filtered signal; a high-order loop filter configured to filter the timing error signal to generate a filtered timing error signal; and a numerically controlled oscillator (NCO) configured to control timing data based on the filtered timing error signal and provide the timing data to the interpolator, wherein the interpolator is configured to correct for timing of the digital signal based on the timing data, and adjust the sampling rate of the digital signal based on the timing data. In some implementations, the high-order loop filter is configured to filter out self-noise generated by the TED due to its nonlinearity.

In some implementations, the wireless communication network comprises a satellite communications network, and the circuitry is configured to receive the analog signal from a satellite transponder of the satellite communications network.

Other features and aspects of the disclosure will become apparent from the following detailed description, taken in conjunction with the accompanying drawings, which illustrate, by way of example, the features in accordance with various embodiments. The summary is not intended to limit the scope of the invention, which is defined solely by the claims attached hereto.

BRIEF DESCRIPTION OF THE DRAWINGS

The technology disclosed herein, in accordance with one or more embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION

As used herein to refer to plotted results, the term "analysis" refers to results generated via mathematical computation, using statistical evaluation of an autocovariance function of an error signal.

As used herein to refer to plotted results, the term "simulation" refers to results measured using a signal generated in software, evaluated on a computer testing system, using Monte Carlo simulation.

One present technique for timing synchronization uses an attractive square-law timing error detector, but it does not compensate for the self-noise associated with it. Another present technique for timing synchronization uses second-order tracking loops. However, second-order loops are not adequate to suppress self-noise. Self-noise is a phenomenon that should not be ignored when operating a communications system with high efficiency. This is so as self-noise may be aggravated by using a signal constellation that may have large cardinality, pulses that may have sharper frequency rolloff, and channels that may endure asymmetric frequency response.

Various implementations of the disclosure are directed to improved timing tracking systems and methods, implementable in receivers, that may achieve superior performance in communication systems that use a constellation of large cardinality, spectrally efficient transmit pulses, and/or possibly asymmetric channel filters. The timing tracking systems and methods described herein may be non-data-aided, blind to carrier phase offset, and handle large uncertainty in carrier frequency. In accordance with implementations, the tracking systems and methods described herein may require only two samples per symbol for the generation of the timing error signal, and they may use high-order tracking loops to achieve superior performance in the face of self-noise, a problem with nonlinear timing error detectors. As further described below, the timing tracking techniques described herein may also have the added advantage of tracking and driving to zero the higher dynamics of an input signal, including clock timing-ramp and/or clock frequency-ramp due to acceleration.

Figure 1:
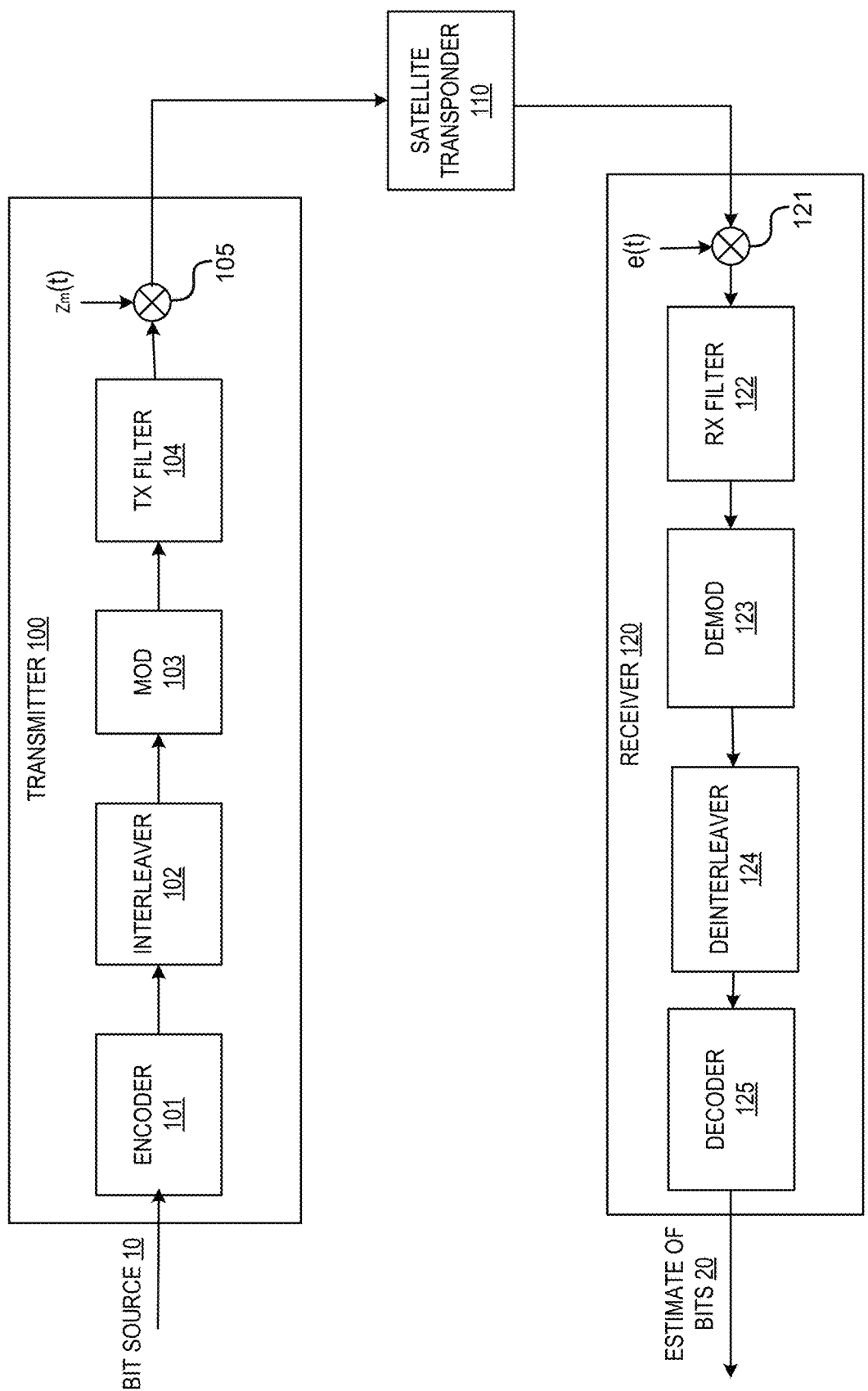
FIG. 1 illustrates an example communication system in which the timing tracking systems described herein may be implemented.

FIG. 1 illustrates an example satellite communication system in which the timing tracking systems and methods described herein may be implemented. It should be noted that although FIG. 1 illustrates a satellite communication system, the disclosed timing tracking techniques may be implemented in other communication systems, including cellular communication systems (e.g., 4G/LTE or 5G communication systems). As shown in the communication system of FIG. 1, a transmitter 100 may transmit a data signal over a communication channel 200 to a receiver 300. The data signal may carry image, video, audio, and/or other information. Although a single channel of communication is shown in this example, it should be appreciated that the technology described herein may be implemented in multichannel communication systems.

In this example, transmitter 100 includes encoder 101, interleaver 102, modulator 103, transmit pulse-shaping filter 104, and mixer 105. In embodiments, transmitter 100 may be a transmitter of a user terminal, such as, for example, a very small aperture terminal (VSAT) that transmits on an inroute. Alternatively, transmitter 100 may be a transmitter of a satellite gateway that transmits on an outroute. Although the components of transmitter 100 are shown in a particular order in this example, one of ordinary skill in the art reading this description will understand that the order of components can be varied and some components may be excluded. One of ordinary skill in the art will understand how other transmitter configurations can be implemented, and that one or more of these components can be implemented in either digital form (e.g., as software running on a DSP or other processing device, with the addition of a DAC) or as analog components. Additionally, although bit sources 10 are illustrated in this example implementation as being separate from transmitter 100, in some implementations bit sources 10 may be incorporated into transmitter 100.

Bit source 10 provides information bits to be transmitted to encoder 101. The information may include, for example, images, video, audio, text and other data. Encoder 101 performs forward error correction by adding redundancy to information data bits of the input signal. Forward error correction (FEC) improves the capacity of a channel by adding redundant information to the data being transmitted through the channel. Examples of forward error correction codes that can be applied by encoder 101 can include block codes (e.g., turbo codes, low-density parity check codes (LDPC), Reed-Solomon codes, Hamming codes, Hadamard codes, BCH codes, and so on), and convolutional codes.

Interleaver 102 scrambles the encoded data bits by rearranging the bit sequence order to make distortion at receiver 120 more independent from bit to bit. In other words, interleaver 102 rearranges the ordering of the data sequence in a one to one deterministic format. Interleaving may be used to enhance the performance of FEC codes Modulator 103 modulates the interleaved bits using a bit-to-symbol modulation scheme to form complex-valued data symbols. The interleaved bits may be modulated using any of a number of different modulation techniques. Examples of modulation schemes that can be implemented include amplitude and phase shift keying (APSK), e.g., 16-APSK or 32-APSK, quadrature phase shift keying (QPSK), 8 PSK, M-ary phase shift keying (MPSK), quadrature amplitude modulation (QAM), and so forth.

Transmit pulse-shaping filter 104 converts the complex-valued data symbols to a to a transmit waveform signal using a pulse shaping function with an impulse response. In implementations, the pulse-shaping filter may be implemented as a root-raised cosine (RRC) filter, a partial response filter, or other suitable pulse shaping filter. Following filtering of the transmit signals at filter 104, mixer 105 of transmitter 100 mixes the waveform signal of the filter output with a carrier signal z(t) from a local oscillator (not shown) to modulate it onto an appropriate carrier for transmission. In embodiments, the carrier signal function $z_m(t)$ for a particular carrier m may be represented as $$\frac{1}{\sqrt{M_c}} e^{j(2\pi f_m t + \theta_m)},$$

where $f_m$ is the center frequency and $\theta_m$ is the carrier phase of m-th channel.

In embodiments where the satellite communication system is a multicarrier system, an adder (not shown) may be provided to add output signals from a plurality of transmitting carrier sources and provide a composite signal. The output signal from the transmitter (e.g., a composite signal) is transmitted to satellite transponder 110. At transponder 110, the signal may be processed through an input multiplexing (IMUX) filter (not shown) to select the desired carrier, amplified (e.g., using a traveling-wave tube amplifier), and output using an output multiplexing (OMUX) filter.

On the downlink reception side, receiver 120 receives an input signal on a carrier from satellite transponder 110 and outputs an estimate of the carrier's bits 20. In this example, receiver 120 includes a mixer 121, a receive filter 122, a demodulator 123, a deinterleaver 124, and a decoder 125. In some embodiments, receiver 120 may be a receiver of a satellite gateway that receives signals on an inroute. In other embodiments, receiver may be a receiver of a user terminal (e.g., VSAT) that receives signals on an outroute. In some embodiments, one or more of the components of receiver 120 may be implemented in an application-specific integrated circuit (ASIC). As would be understood by one having ordinary skill in the art, in some embodiments other configurations of receiver 120 may be implemented, and one or more components of receiver 120 can be implemented in either digital form (e.g., as software running on a DSP or other processing device, with the addition of a DAC) or as analog components.

Mixer 121 mixes the input waveform signal received from transponder 110 with a carrier down conversion signal e(t) from a local oscillator (not shown) to downconvert the received signal to baseband. In embodiments, the carrier down conversion signal may be represented as $e^{-j(2\pi f_m t + \theta_m)}$ where $f_m$ is the center frequency and $\theta_m$ is the carrier phase of the m-th channel.

Receive filter 122 is configured to apply a receive filtering function to the downcoverted carrier signal. Examples of receive filters that may be implemented include root-raised cosine (RRC) filters and partial response filters. In some implementations, receive filter 122 may be matched to transmit filter 104.

Demodulator 123 is configured to demodulate the receive signal by applying a symbol-to-bit demodulation scheme that reverses the bit-to-symbol modulation of transmitter modulator 103. For example, demodulator 123 may implement demodulation schemes such as APSK, e.g., 16-APSK, 32-APSK, 64-APSK, 128-APSK, or 256-APSK, QPSK, 8 PSK, MPSK, QAM, and so forth.

The demodulated signal may pass through deinterleaver 124, which reverses the function of interleaver 102. Decoder 125 decodes the demodulated signal to output an estimate of the bits 20.

Figure 2:
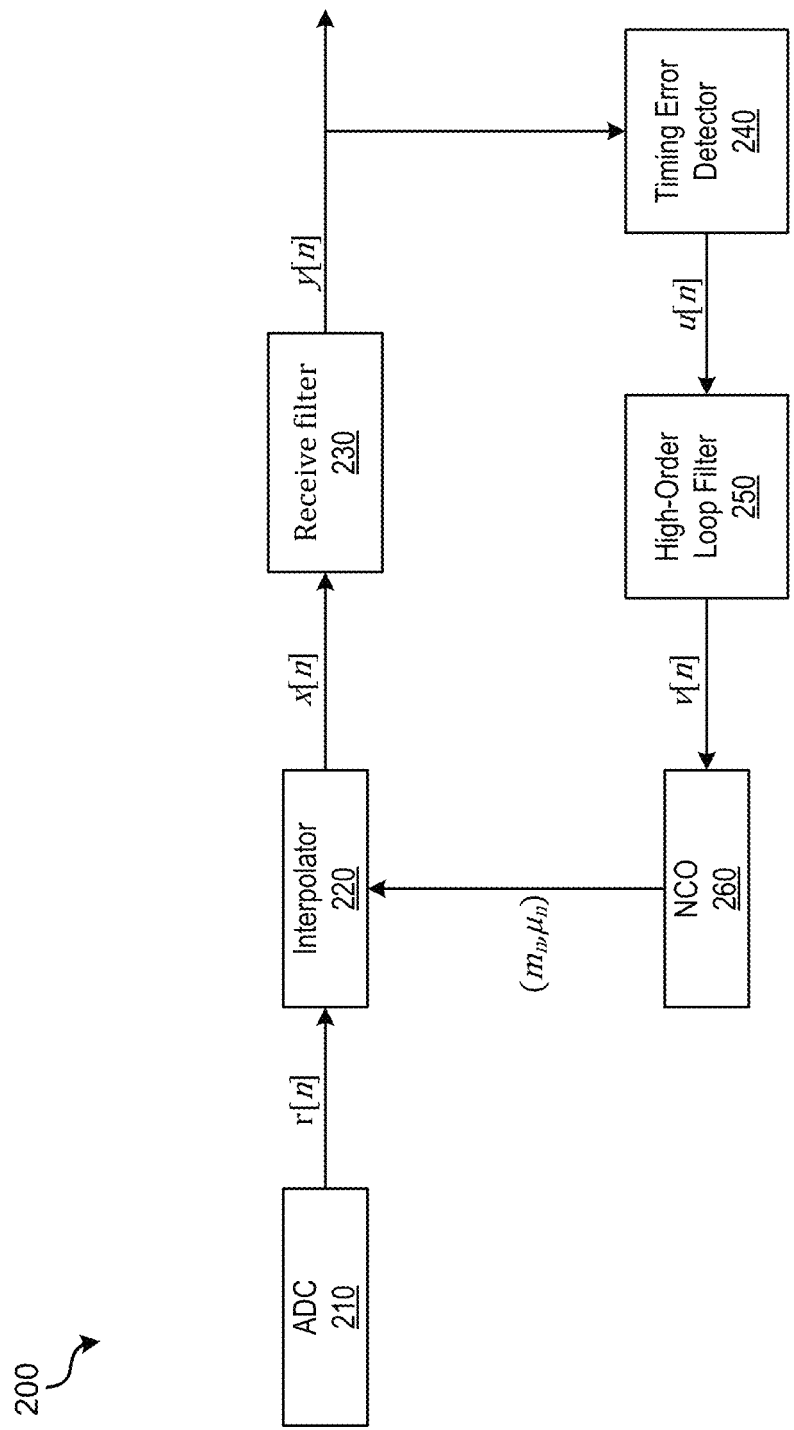
FIG. 2 is a block diagram illustrating components of a high-order timing tracking loop of a receiver, in accordance with implementations of the disclosure.

FIG. 2 is a block diagram illustrating components of a high-order symbol-timing tracking loop or system 200 of a receiver, in accordance with implementations of the disclosure. Symbol timing tracking loop 200 may be configured to take a noisy received signal and estimate a receiver clock that is aligned in phase and frequency with a transmitter clock. In implementations, symbol timing tracking loop 200 operates as a high-order loop, meaning it is of third order or higher. Symbol-timing tracking loop 200 may be implemented in receiver 120 of the satellite communication system of FIG. 1. Symbol-timing tracking loop 200 may include an analog-to-digital converter (ADC) 210, an interpolator 220, a receive filter 230, a nonlinear timing error detector 240, a high-order loop filter 250, and a numerically controlled oscillator (NCO) 260. It should be noted that the various components of timing tracking loop 200 may be implemented using hardware (e.g., circuitry), software, or some combination thereof. It should also be noted that for simplicity of illustration, some components of symbol-timing tracking loop 200 may be omitted from FIG. 2. In particular implementations, symbol-timing tracking loop 200 may be a component of an ASIC.

The signal r(t) received at symbol-timing tracking loop 200 may be an analog signal comprising complex-valued symbols drawn from M-ary constellation, such as APSK, shaped by a transmit pulse filter, such as a bandwidth-efficient root raised-cosine (RRC). Additionally, the received signal may contain unknown carrier phase offset, may be shifted in time by unknown amount, may be shifted in frequency by unknown amount, and/or may be corrupted by additive white Gaussian noise (AWGN).

ADC 210 is configured to sample the received analog signal to generate a digital signal r[n]. The generated digital signal r[n] may be clocked at a different rate, and with a timing offset. In example symbol-timing tracking loop 200, all components after ADC 210 operate in the digital domain.

Interpolator 220 is configured to adjust a sampling rate of the sampled digital signal (e.g., to two samples per symbol) to generate an interpolated signal x[n]. Additionally, interpolator 220 is configured to correct for timing of the sampled digital signal based on timing data (e.g., fractional time) received from NCO 260. In various implementations, interpolator 220 implements sampling-rate conversion such that its output is clocked at two samples per symbol.

Receive filter 230 is configured to apply a receive filtering function to the interpolated signal x[n] to generate a filtered signal y[n] that minimizes noise outside of the signal band. In some implementations, filter 230 may correspond to receiver filter 122. In some implementations, receive filter 230 may be matched to a corresponding transmit-pulse-shaping filter (e.g., filter 104). In particular implementations, receive filter 230 and its corresponding transmit filter may be RRC filters, which may achieve high spectral efficiency with a sharp roll-off. In other implementations, other filters and/or mismatched transmit/receive filters may be used.

Timing error detector (TED) 240 is configured to receive the filtered signal y[n] and generate a timing error signal u[n] comprising timing error information (e.g., timing error information about error between local oscillator and remote timing reference in it). The timing error signal may be generated by passing a delay-differenced signal through a square-law clock generator. The timing error information may comprise clock phase error and/or clock frequency error information, and it may be driven to zero as symbol-timing tracking loop 200 iterates. TED 240 may operate at two samples/symbol to compute timing errors. TED may be a non-data-aided TED, meaning it does not require any knowledge of the transmitted data. Additionally, it may be configured to function without knowing the carrier phase or the carrier frequency of the received signal. By virtue of having these properties, TED 240 may implement timing error detection as the very first function of the receiver's demodulator, operating without the requirements of knowing what the data is, establishing the carrier phase, and/or estimating the frequency to a high accuracy.

In some implementations, TED 240 may be a non-linear TED. For example, in order to function without knowing the carrier phase and/or carrier frequency of the received signal, TED 240 may be based on the Gardner algorithm, further discussed below, which applies a product of the filtered signal, a type of squaring operation that introduces nonlinearity to gain immunity against the carrier phase and/or carrier frequency. This non-linearity may generate self-noise.

High-order loop filter 250 is configured to filter the timing error signal u[n] generated by TED 240 to generate filtered timing error signal v[n]. High-order loop filter 250 is configured to operate within a loop of third order or higher. In implementations where TED 240 is nonlinear, high-order loop filter 250 may filter out self-noise generated by nonlinear TED 240 due to its nonlinearity, e.g., by providing a steeper roll-off of the system's frequency response. For example, it may provide a roll-off greater than −20 dB/decade. In some implementations, the roll off may −40 dB/decade, or even greater than −40 dB/decade. High-order loop filter 250 may also be configured to track higher order dynamics of the timing signal, including clock timing-ramp and/or clock frequency-ramp due to acceleration. In some implementations, high-order loop filter 250 may be an infinite impulse response (IIR) filter. For example, it may be implemented as a high-order discrete-time IIR having a fast error transient response. In other implementations, filter 200 may be a finite impulse response (FIR) filter. By virtue of being a high-order loop filter (i.e., operating within a loop of at least third order or higher), the filtering capability of the self-noise generated by nonlinear TED 240 may be improved relative to prior timing synchronization techniques. Additionally, higher order dynamics of the timing signal may be tracked to zero. For example, a timing error signal may track a clock frequency-ramp error to zero.

NCO 260 is configured to control timing data (e.g., fractional-time information) from the filtered timing error signal and provide the timing data to the interpolator 220. The interpolator may correct for timing of the digital signal based on the received timing data, and adjust the sampling rate of the digital signal based on the received timing data. As depicted in the example of FIG. 2, NCO 260 may output $(m_n, \mu_n)$ to interpolator 220, where $\mu_n$ represents the fractional timing relative to a symbol duration, and $m_n$ is the basepoint index.

In particular implementations, the signals and components associated with symbol-timing tracking loop 200 may be mathematically described as follows.

The received analog signal r(t) may be mathematically expressed by Equation (1):

$$r(t) = e^{j\theta} \cdot \sum_{i=-\infty}^{\infty} a_i \cdot p_T(t - iT_s - \tau) + w(t), \tag{1}$$

where r(t) is an analog signal comprising complex-valued symbols $\alpha_i$ drawn from M-ary constellation, shaped by transmit pulse $p_T(t)$, and $T_S$ is the symbol duration. Additionally, in this example, $\theta$ is an unknown carrier phase offset of the signal, $\tau$ is an unknown time shift, and w(t) is additive white Gaussian noise (AWGN) corrupting the signal.

In some implementations, the interpolator 220 may obtain new samples at specified fractional-time instants, $\mu_n$, and it may be described mathematically as x[n] by Equation (2):

$$x[n] = \sum_{i=I_1}^{I_2} r[m_n - i] \cdot h[i + \mu_n], \quad (2)$$

where r[n] is the sampled output of the ADC, $m_n$ is the integer-part of the timing estimate, and $h[i+\mu_n]$ is an interpolating filter that is time-variant with a span of $(I_2-I_1+1)$ taps. The interpolator may implement sampling-rate conversion so that its output is clocked at two samples per symbol. The receive filter $p_R[n]$ may be selected to maximize signal-to-noise ratio (SNR) by being matched to the transmit pulse, or $p_R[n]=p_T^*[-n]$, generating the output y[n] at two samples per symbol.

In some implementations, the nonlinear TED 240 may be chosen based on the Gardner algorithm described in F. M. Gardner, "A BPSK/QPSK Timing-Error Detector for Sampled Receivers," in IEEE Transactions on Communications, vol. 34, no. 5, pp. 423-429, May 1986, incorporated herein by reference, which may be described by Equation (3):

$$u[n]=\text{Real}\{y^*[n-0.5]\cdot(y[n]-y[n-1])\} \quad (3)$$

In some implementations, the high-order loop filter 250 may be a discrete-time IIR filter mathematically described by Equation (4):

$$v[n] = \sum_{k=0}^{N_\beta} \beta_k \cdot u[n-k] - \sum_{k=1}^{N_\alpha} \alpha_k \cdot v[n-k], \quad (4)$$

where $N_\alpha$ and $N_\beta$ are the orders of the feedback and feedforward filtering operations, respectively, $\alpha_k$ and $\beta_k$ are constants, and u[n] and v[n] are the input and output of the high-order loop filter, respectively.

In some implementations, the NCO 260 may configured to extract the fractional-time from the loop-filter output through an accumulator with modulo-one operation, mathematically described by Equation (5):

$$\mu_n=\text{mod}(\mu_{n-1}+K_{NCO}\cdot v[n],1) \quad (5)$$

where $K_{NCO}$ is the gain associated with the NCO.

As discussed above, there are many advantages that may be achieved from using a nonlinear timing error detector 240, including that it may be non-data aided, it may be independent of the carrier phase, and it may handle a large amount of initial frequency offset. In some implementations, this enables timing synchronization to be the first step performed in a demodulation procedure at a receiver's demodulator, e.g., before frame synchronization and carrier phase and frequency acquisition.

Figure 3:
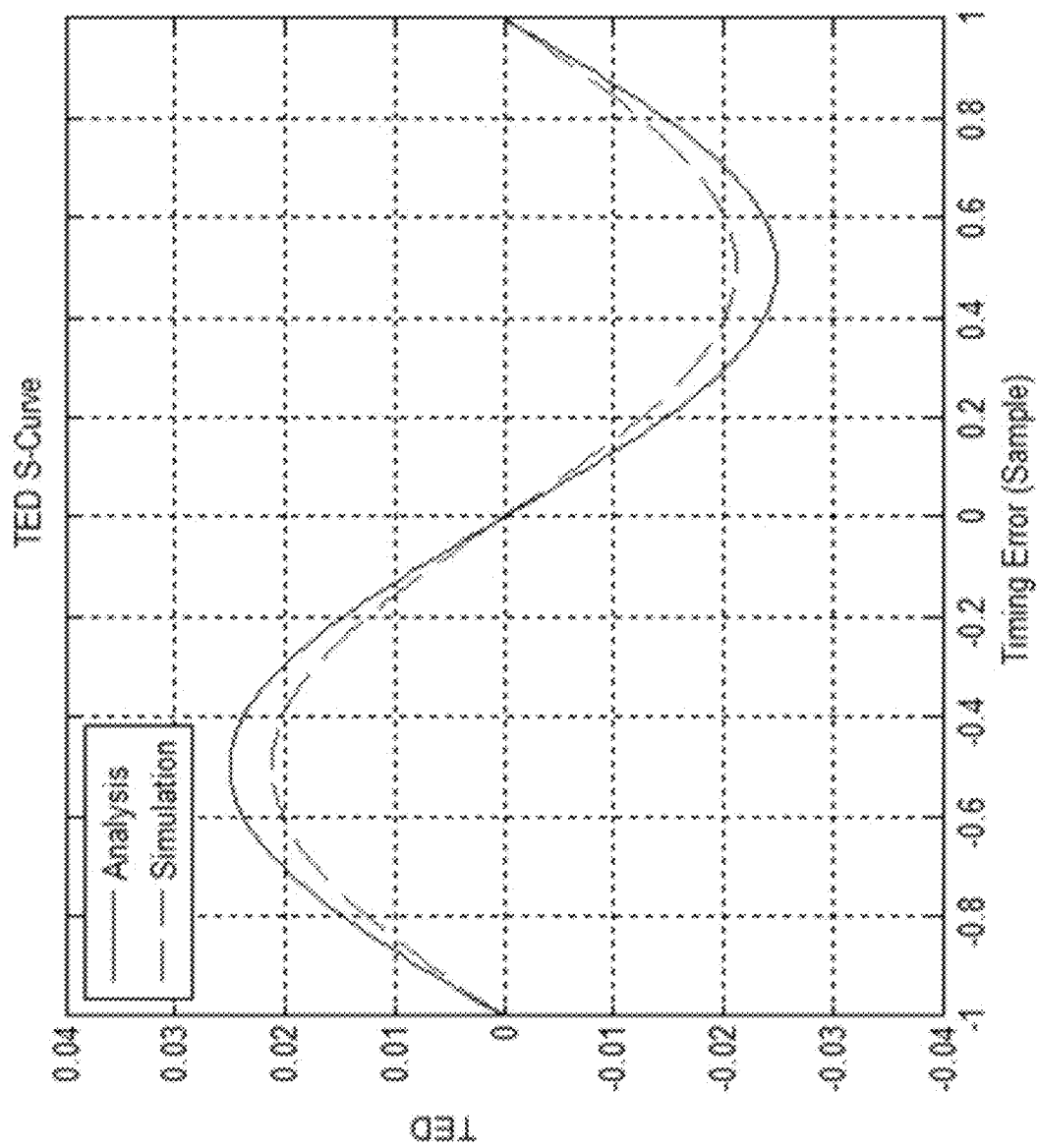
FIG. 3 is a plot illustrating the S-curve of a nonlinear timing error detector (TED) in accordance with implementations of the disclosure, computed via analysis and simulation, when using RRC filters with a rolloff of 5% (0.05) and 32 APSK modulation.

To appreciate the benefits of using a nonlinear TED in accordance with the disclosure, it is instructive to consider the open-loop characteristics of a nonlinear TED described above. To this end, FIG. 3 is a plot illustrating the S-curve of a nonlinear TED in accordance with implementations of the disclosure, computed via analysis and simulation, when using RRC filters with a rolloff of 5% (0.05) and 32 APSK modulation. In this instance, the S-curve shows first order information associated with the non-linear TED, which represents the mean of the non-linear TED. As depicted, the non-linear TED is sinusoidally dependent on the timing error and crosses zero at the origin, indicating its unbiased nature. An important parameter for the operation of the tracking loop is the timing error gain, which may be determined from the S-curve by computing the slope at zero timing offset and is equal to 0.05 in this example. Without being data-aided, the TED may be extracted to obtain a value that responds well to the actual timing error.

Figure 4:
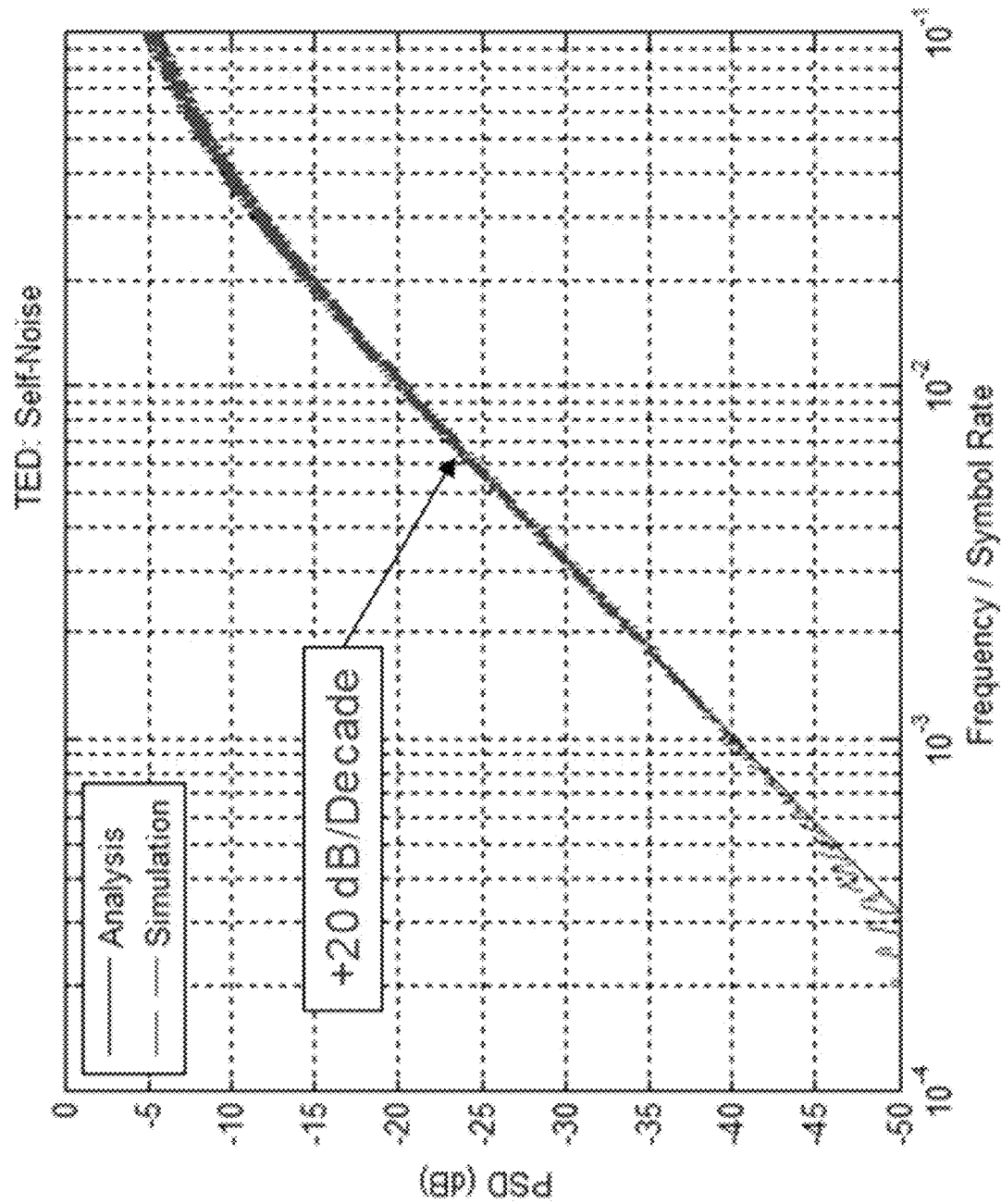
FIG. 4 is a plot of power spectral density (PSD) in decibels (dB) as a function of frequency/symbol rate illustrating the self-noise associated with a nonlinear TED in accordance with implementations of the disclosure, computed via analysis and simulation, when using RRC filters with a rolloff of 0.05 and 32 APSK modulation.

To obtain the second order information associated with a nonlinear TED, the frequency domain may be examined to determine how much jitter is being experienced around the mean. To this end, FIG. 4 is a plot of power spectral density (PSD) in decibels (dB) as a function of frequency/symbol rate illustrating the self-noise associated with a nonlinear TED in accordance with implementations of the disclosure, computed via analysis and simulation, when using RRC filters with a rolloff of 0.05 and 32 APSK modulation. As depicted by FIG. 4, there is close agreement between analysis and simulation, showing that the self-noise exhibits high frequency behavior with a slope of +20 dB/decade. As the foregoing example illustrates, a non-linear TED may inject a significant amount of self-noise into the receiver signal due to its non-linear nature. When employing small roll-off and large signal constellation, which may be common in highly efficient communication systems, in some implementations this self-noise may not be ignored.

To appreciate the advantages of high-order loop filter designs to mitigate the self-noise introduced by the nonlinear TED, it is instructive to consider loop filters that may achieve a steady-state error of zero when the loop input is a clock frequency-step. A second-order type II loop is one example that is conventionally adopted. However, its closed-loop system response may only achieve low-pass filtering with a slope of −20 dB/decade. As illustrated by FIG. 4, this is not adequate to tackle the high-frequency self-noise that is present in communications systems operated with high efficiency.

To address this deficiency, implementations of the disclosure utilize loop filters resulting in tracking loops that perform additional filtering of the self-noise source. This is achieved by implementing high-order loops, i.e., loops with higher than second order.

Figure 5:
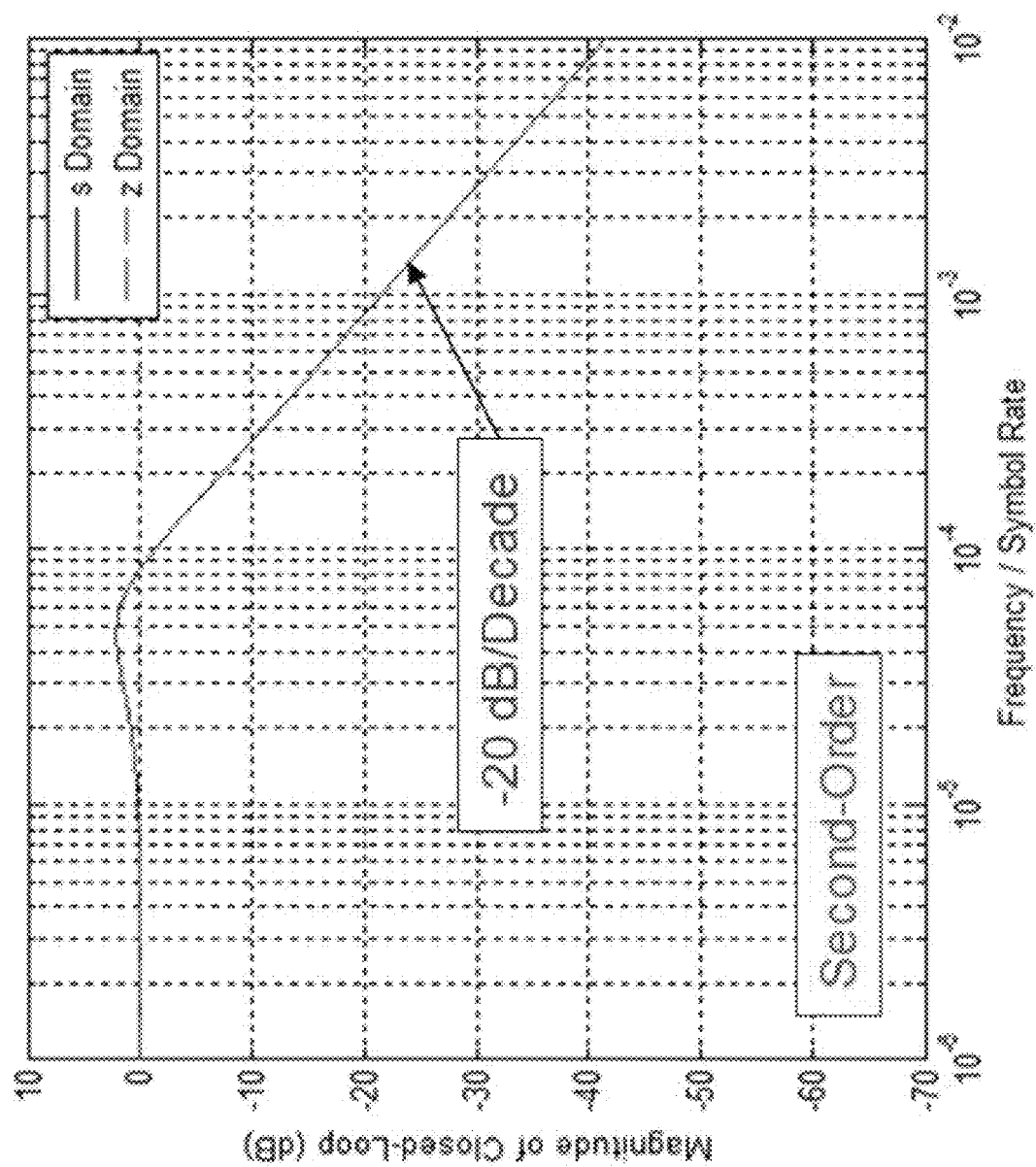
FIG. 5 is a plot illustrating a magnitude of a closed-loop system response (dB) as a function of frequency/symbol rate for a second-order type II loop operated at a loop bandwidth of 0.02% of the symbol rate.
Figure 6:
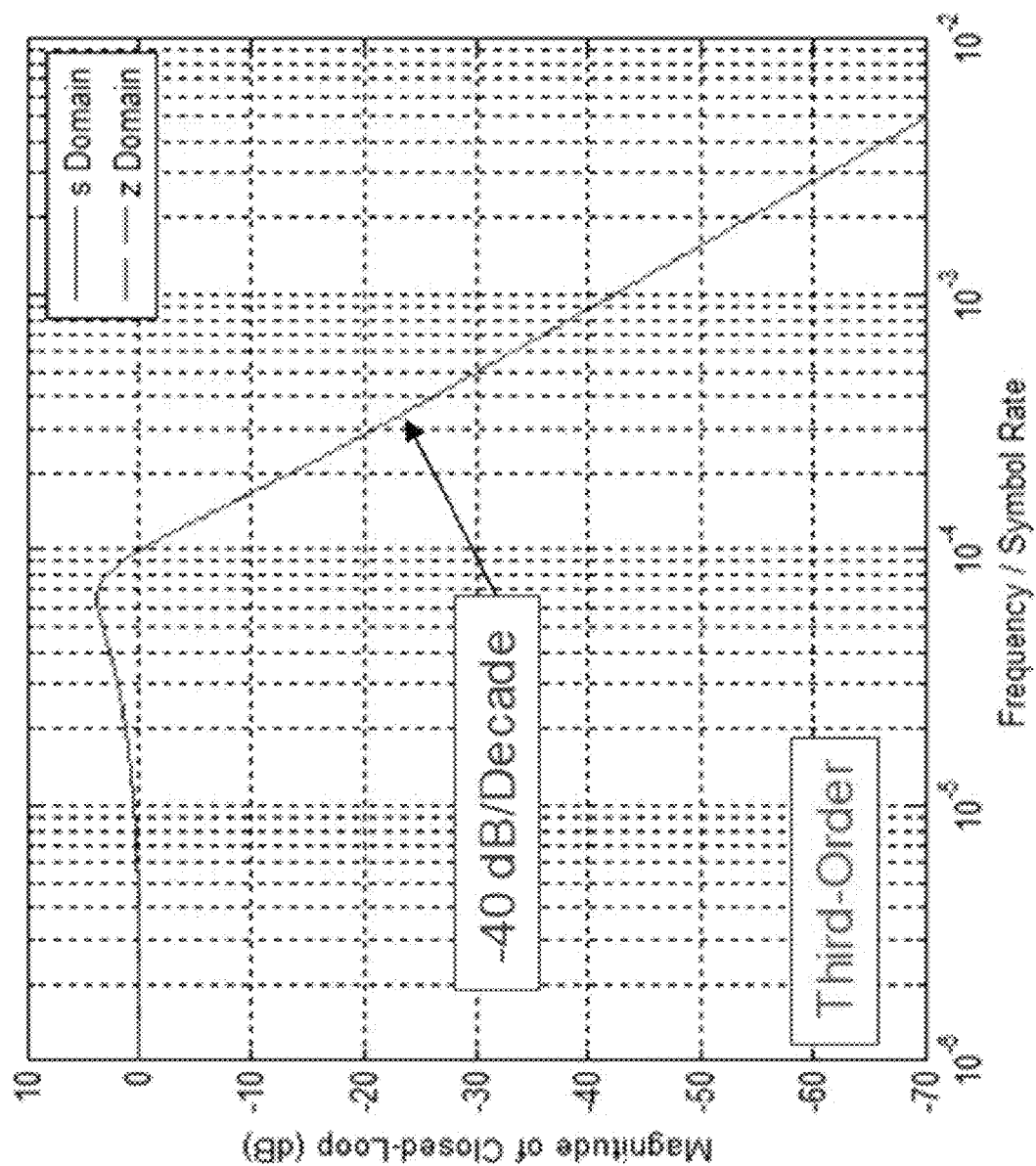
FIG. 6 is a plot illustrating a magnitude of a closed-loop system response (dB) as a function of frequency/symbol rate for a third-order type II loop operated at a loop bandwidth of 0.02% of the symbol rate, in accordance with implementations of the disclosure.

FIGS. 5 and 6 are plots illustrating a magnitude of a closed-loop system response (dB) as a function of frequency/symbol rate for a second-order type II loop (FIG. 5) and third-order type II loop (FIG. 6) operating at a loop bandwidth of 0.02% of the symbol rate. As depicted, the third-order loop has additional filtering capability against the self-noise of the TED. In particular, whereas the second-order loop slopes only at −20 dB/decade, the third-order loop slopes at −40 dB/decade.

Figure 7:
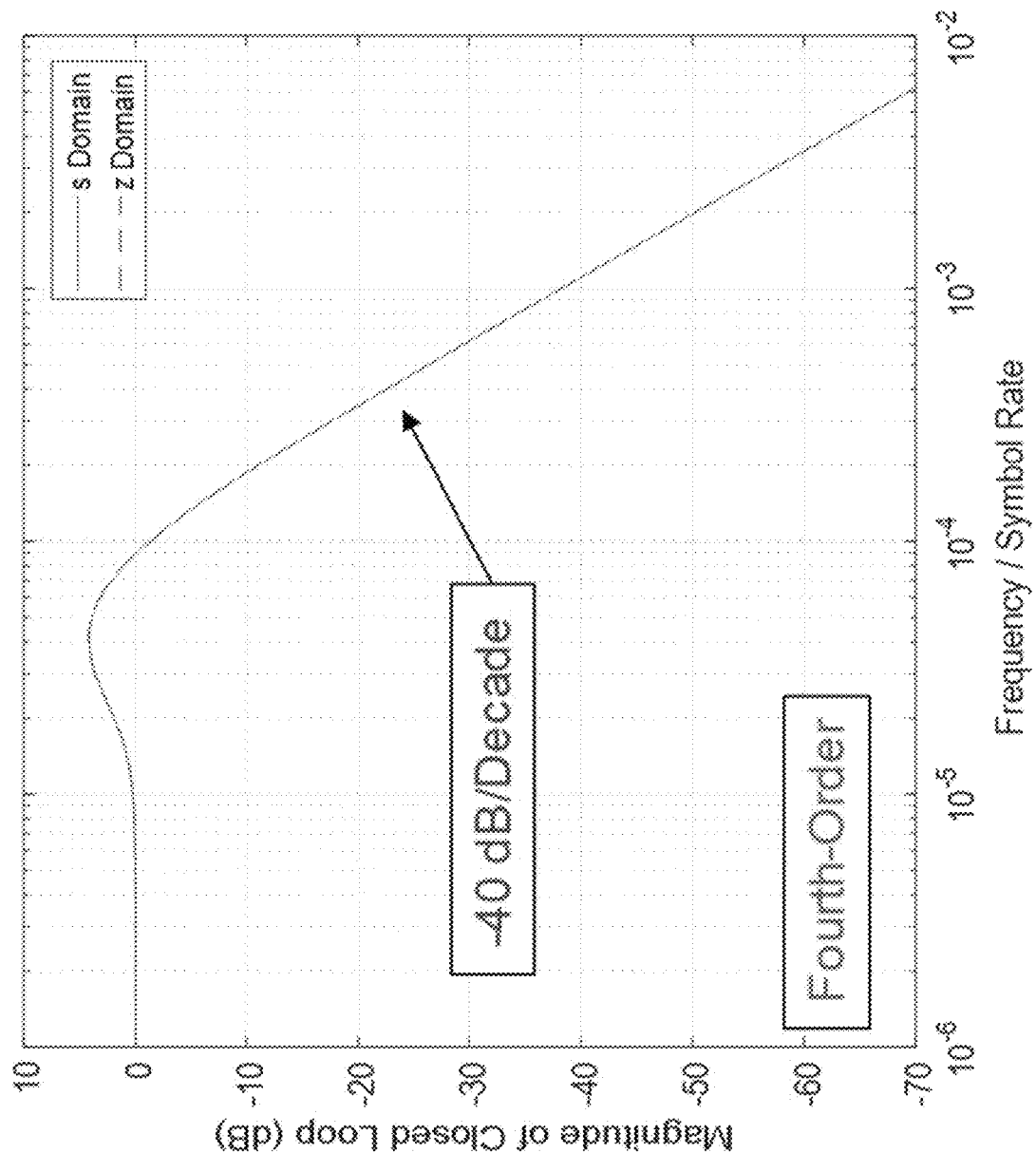
FIG. 7 is a plot illustrating a magnitude of a closed-loop system response (dB) as a function of frequency/symbol rate for a fourth-order type III loop operated at a loop bandwidth of 0.02% of the symbol rate, in accordance with implementations of the disclosure.

In some implementations, fourth-order loop filters may be utilized to achieve a steady-state error of zero when the loop input has a clock frequency-ramp—a requirement not satisfied by a second-order type II loop. To this end, FIG. 7 is a plot illustrating a magnitude of a closed-loop system response (dB) as a function of frequency/symbol rate for a fourth-order type III loop operated at a loop bandwidth of 0.02% of the symbol rate, in accordance with implementations of the disclosure. FIG. 7 depicts the additional filtering capability of a fourth-order filtering loop as it slopes at −40 dB/decade, instead of only −20 dB/decade for its second-order counterpart. In addition, by virtue of using fourth order filtering loop, a clock-frequency ramp may be tracked. For example, a clock error caused by a clock-frequency ramp due to acceleration between a transmitter and receiver (e.g., from having the receiver and/or transmitter on a moving vehicle or aircraft) may be tracked.

As the foregoing examples illustrate, by virtue of the additional filtering provided from use of loop filters configured to establish a loop of third order or higher, the self-noise introduced by the nonlinearity of the TED may be reduced. Although the foregoing examples are described with respect to tracking clock-frequency ramp, in some implementations even greater than fourth order loop filters may be used to track clock errors due to even higher order dynamics.

Figure 8:
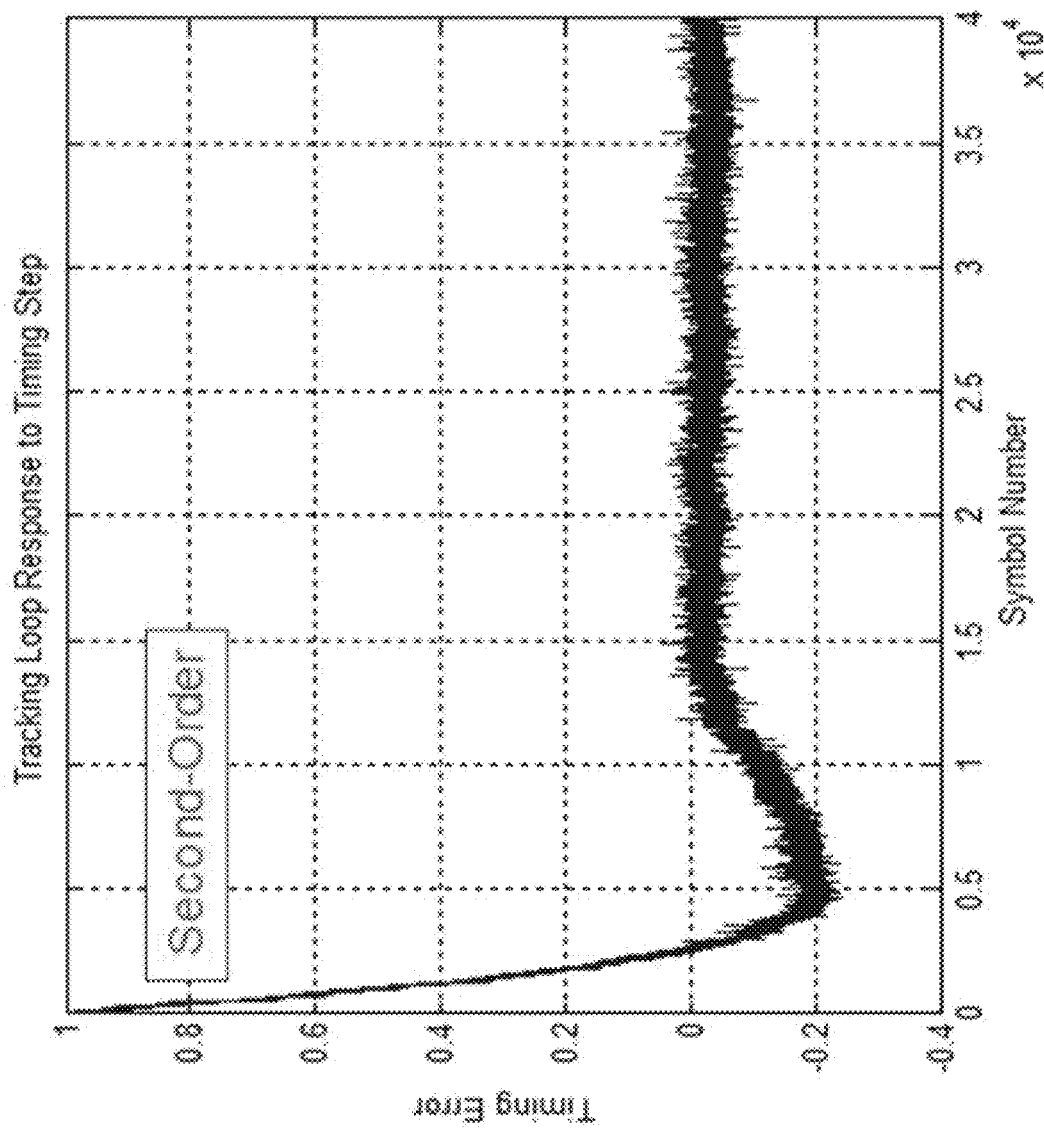
FIG. 8 is a plot illustrating simulation results of a transient error response of a second-order loop when the loop input is a clock timing-step, using 32 APSK modulation and RRC filters, operated at a loop bandwidth of 0.02% of the symbol rate.
Figure 9:
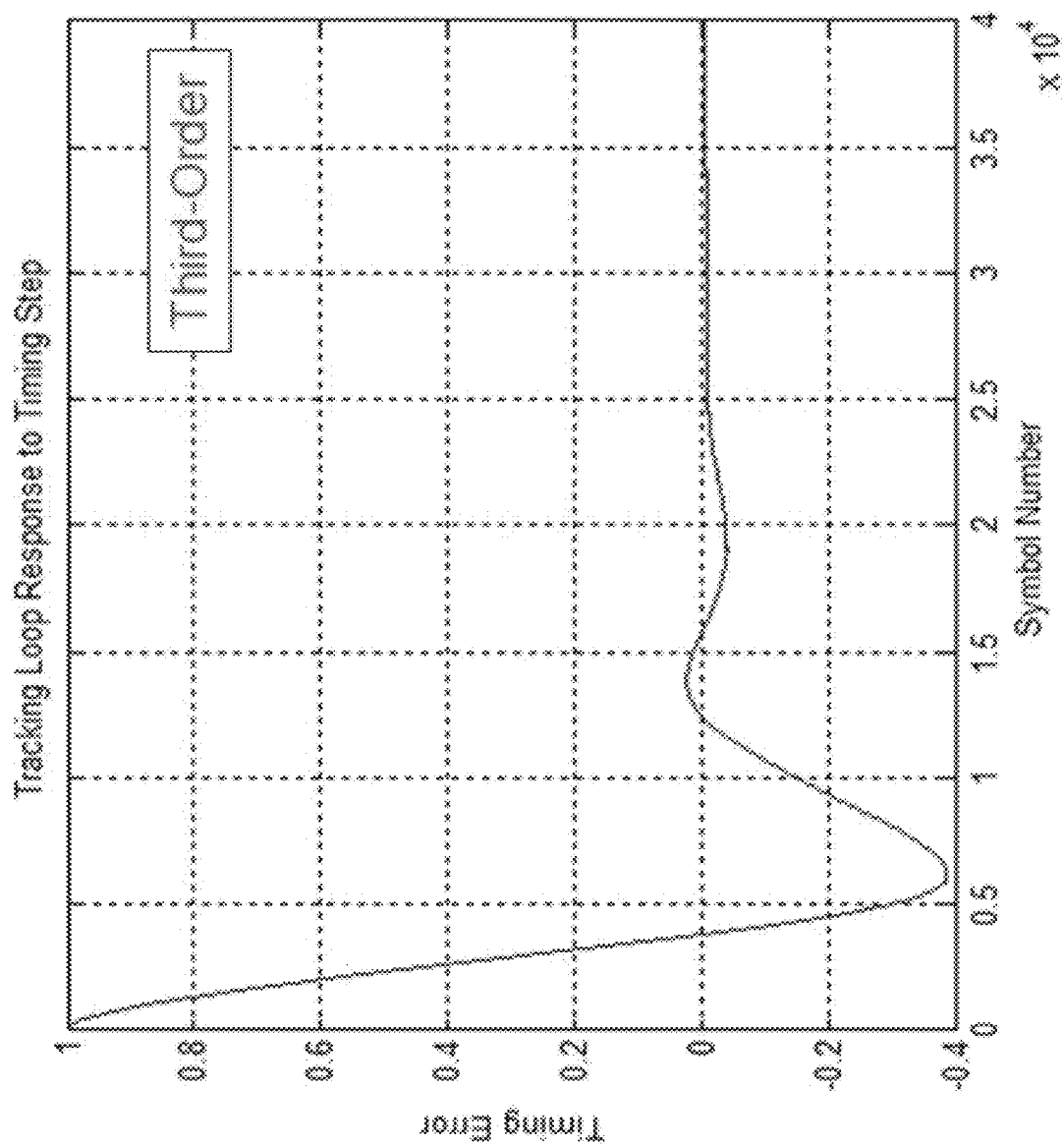
FIG. 9 is a plot illustrating simulation results of a transient error response of a third-order loop when the loop input is a clock timing-step, using 32 APSK modulation and RRC filters, operated at a loop bandwidth of 0.02% of the symbol rate, in accordance with implementations of the disclosure.

FIGS. 8 and 9 are plots illustrating simulation results of transient error responses for a second-order loop (FIG. 8) and third-order loop (FIG. 9), when the loop input is a clock timing-step, using 32 APSK modulation and RRC filters, at a loop bandwidth of 0.02% of the symbol rate. As illustrated, both loops are capable of driving a clock timing-step error to zero. However, whereas self-noise induces noticeable high-frequency jitter in the second-order loop, this high-frequency jitter is not noticeable in the third-order loop.

Figure 10:
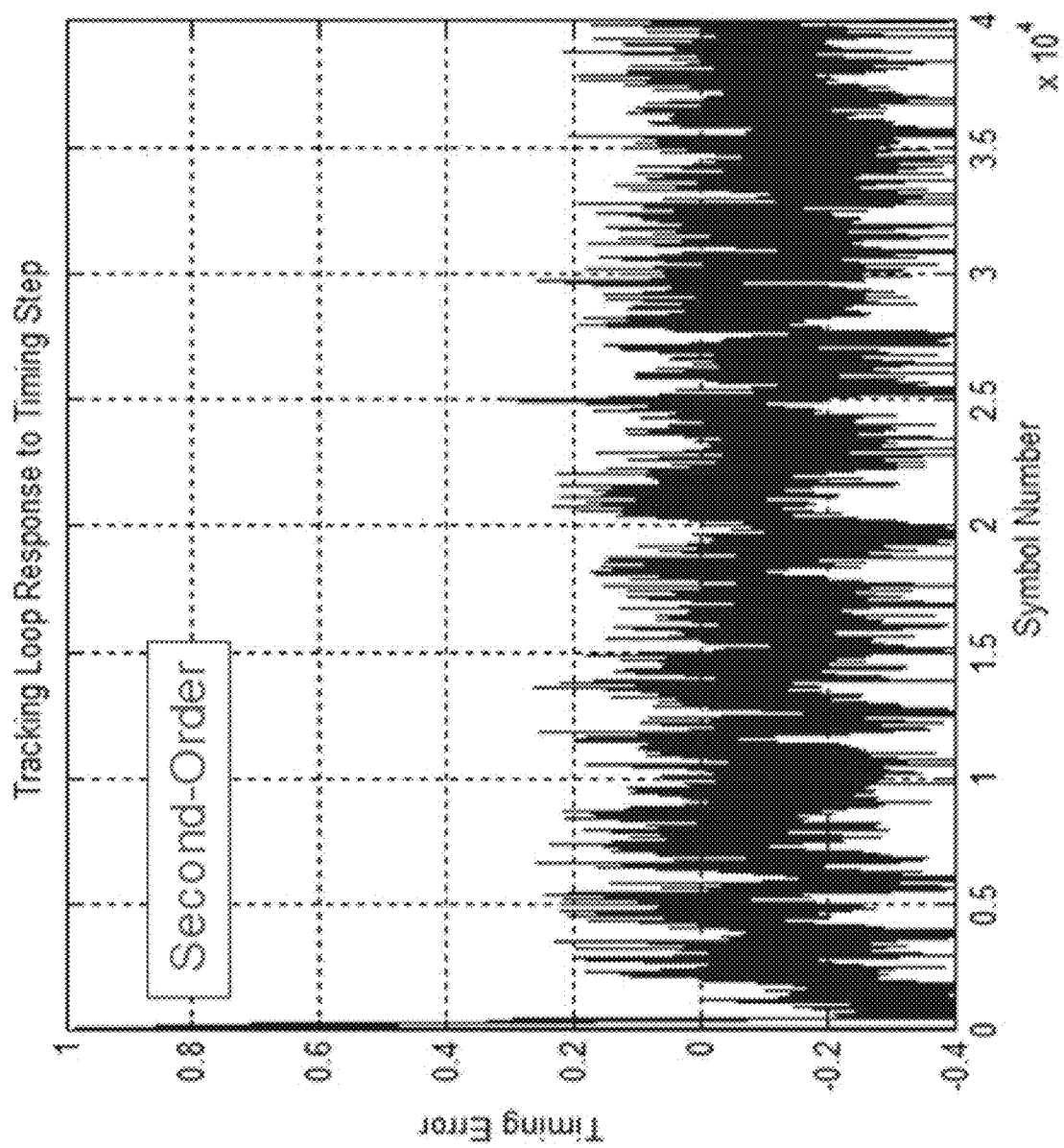
FIG. 10 is a plot illustrating simulation results of a transient error response of a second-order loop when the loop input is a clock timing-step, using 32 APSK modulation and RRC filters, operated at a loop bandwidth of 0.1% of the symbol rate.
Figure 11:
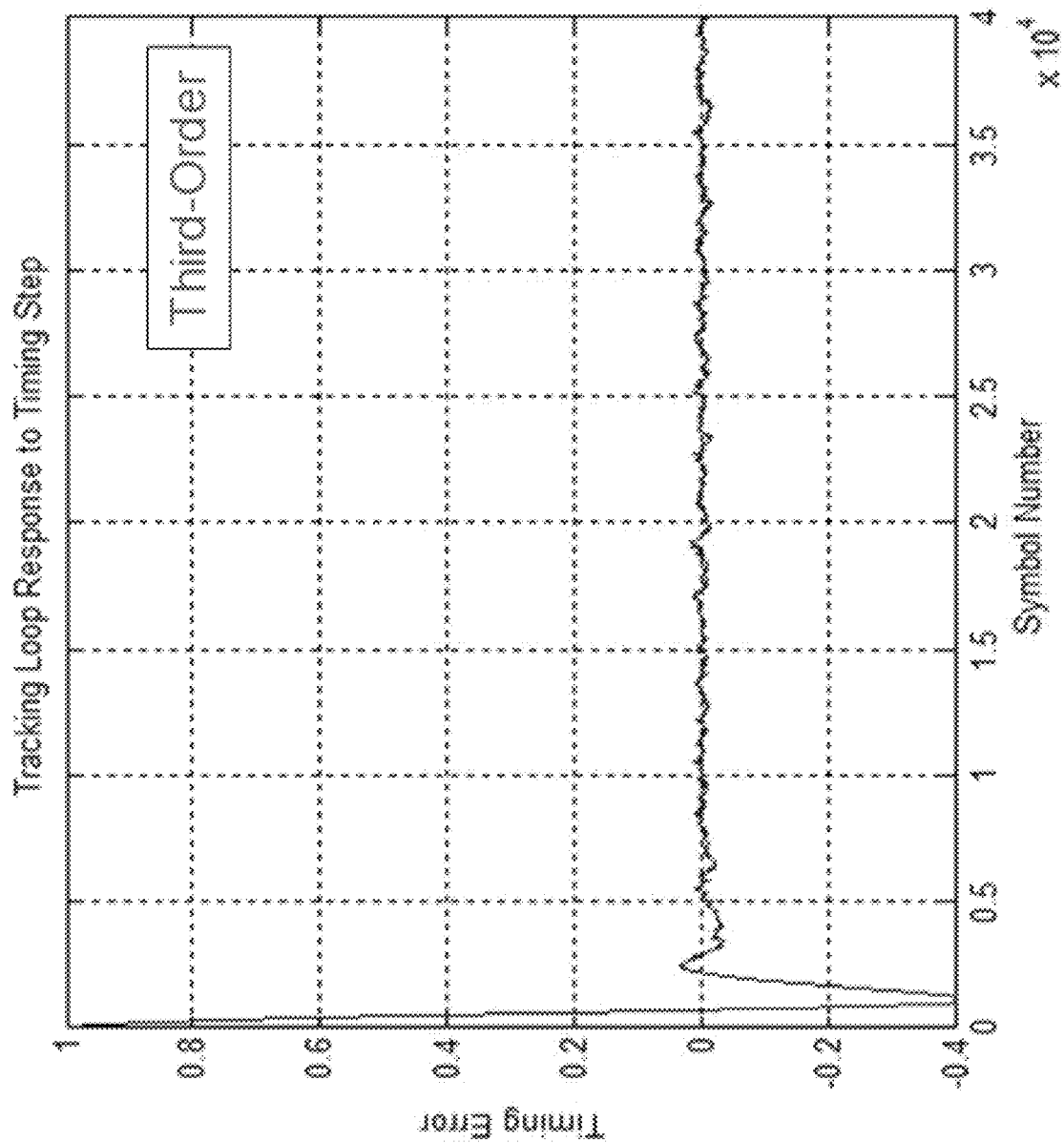
FIG. 11 is a plot illustrating simulation results of a transient error response of a third-order loop when the loop input is a clock timing-step, using 32 APSK modulation and RRC filters, operated at a loop bandwidth of 0.1% of the symbol rate, in accordance with implementations of the disclosure.

Another advantage from using a higher-order loop is that the loop bandwidth may be increased, shortening the transient response time to achieve faster transient responses. FIGS. 10 and 11 are plots illustrating simulation results of transient error responses for a second-order loop (FIG. 10) and third-order loop (FIG. 11), when the input is a clock timing-step, using 32 APSK modulation and RRC filters, and at a loop bandwidth of 0.1% of the symbol rate. It is observed that the second-order loop is inoperable at this bandwidth, preventing it from having a fast transient response. In comparison, the third-order loop is much better behaved, reaching a steady-state of zero in about 5000 symbols. As the foregoing examples illustrate, using a higher order loop in the presence of self-noise, the transient response time may be reduced without suffering in performance.

Figure 12:
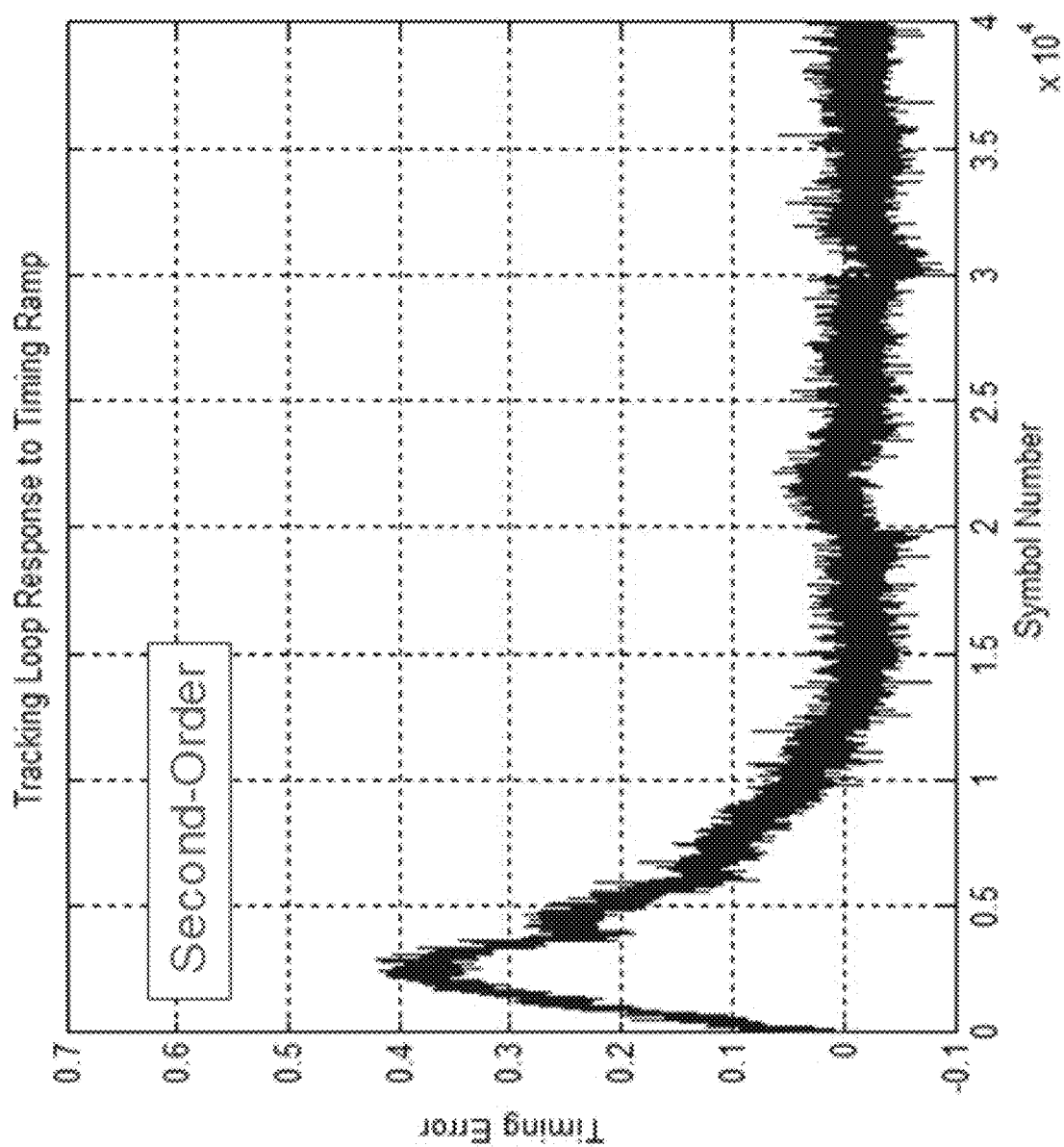
FIG. 12 is a plot illustrating simulation results of a transient error response of a second-order loop when the loop input is a clock timing-ramp, using 32 APSK modulation and RRC filters, operated at a loop bandwidth of 0.02% of the symbol rate.
Figure 13:
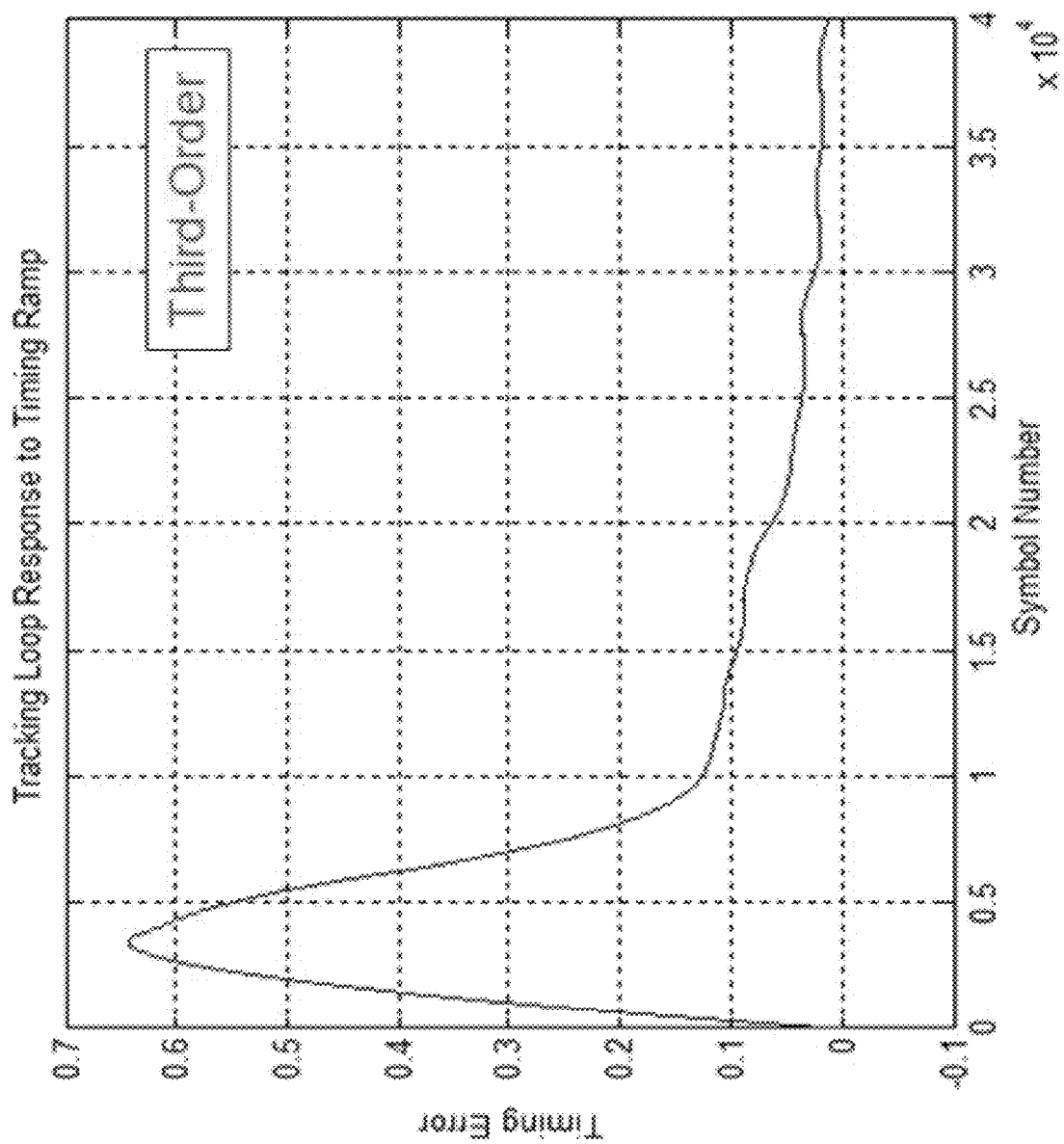
FIG. 13 is a plot illustrating simulation results of a transient error response of a third-order loop when the loop input is a clock timing-ramp, using 32 APSK modulation and RRC filters, operated at a loop bandwidth of 0.02% of the symbol rate, in accordance with implementations of the disclosure.

FIGS. 12 and 13 are plots illustrating simulation results of transient error responses for a second-order loop (FIG. 12) and third-order loop (FIG. 13), when the input is a clock timing-ramp, using 32 APSK modulation and RRC filters, at a loop bandwidth of 0.02% of the symbol rate. As illustrated, both loops are capable of driving a clock timing-ramp error to zero. However, whereas self-noise induces noticeable high-frequency jitter in the second-order loop, this high-frequency jitter is not noticeable in the third-order loop.

Figure 14:
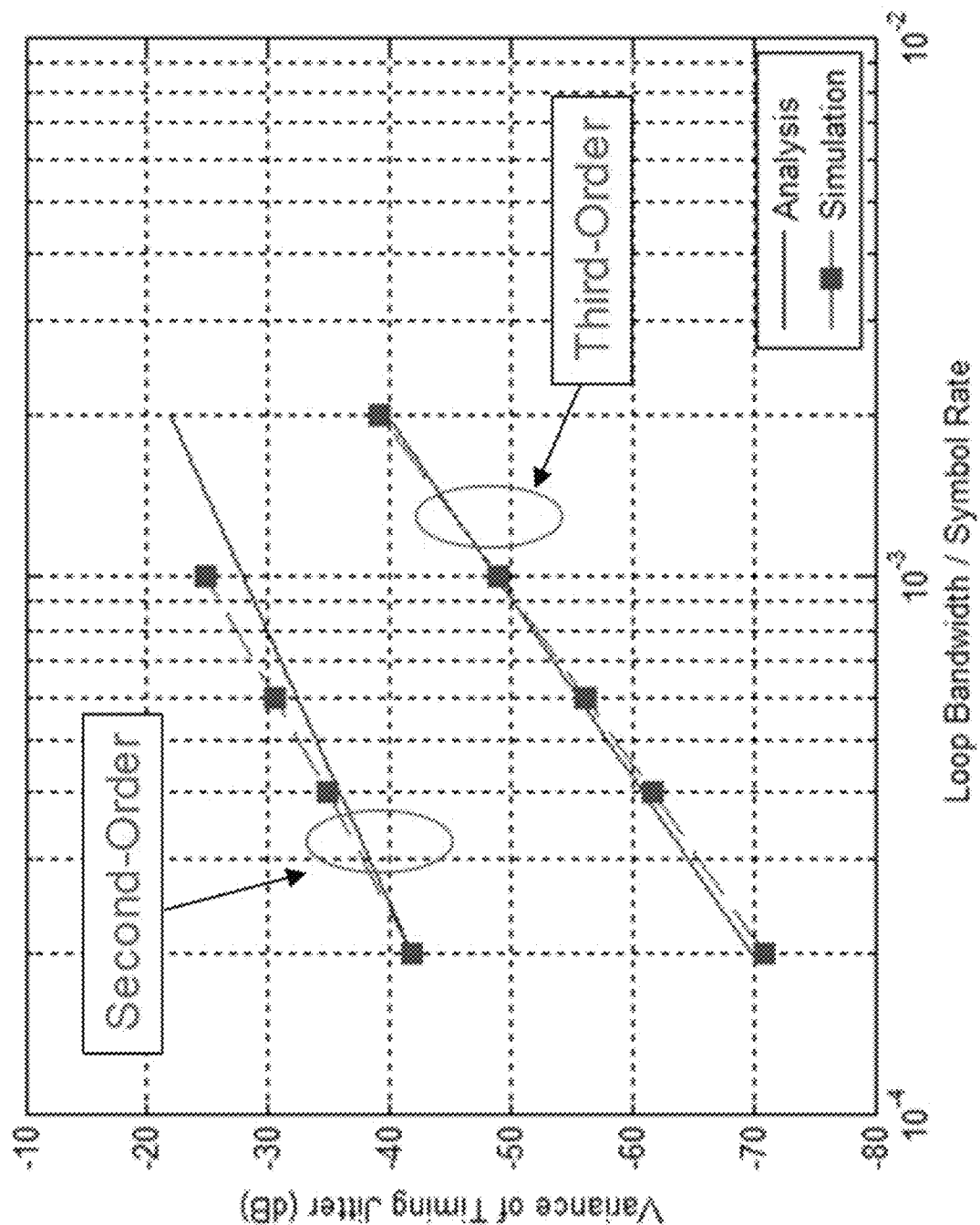
FIG. 14 is a plot illustrating analysis and simulation results of timing jitter variance due to nonlinear TED self-noise as a function of the loop bandwidth, for a second-order loop versus a third-order loop in accordance with the disclosure, when using 32 APSK modulation and RRC filters with a rolloff of 0.05.

FIG. 14 is a plot illustrating analysis and simulation results of timing jitter variance due to nonlinear TED self-noise as a function of the loop bandwidth, for a second-order loop versus a third-order loop in accordance with the disclosure, when using 32 APSK modulation and RRC filters with a rolloff of 0.05. As illustrated, the third-order loop offers large reduction in timing jitter from self-noise relative to its second-order counterpart: performance improvement of 30 dB at bandwidth of 0.02% of the symbol rate and 24 dB at bandwidth of 0.10% of the symbol rate. Additionally, FIG. 14 illustrates close agreement between the analysis and simulation results.

Figure 15:
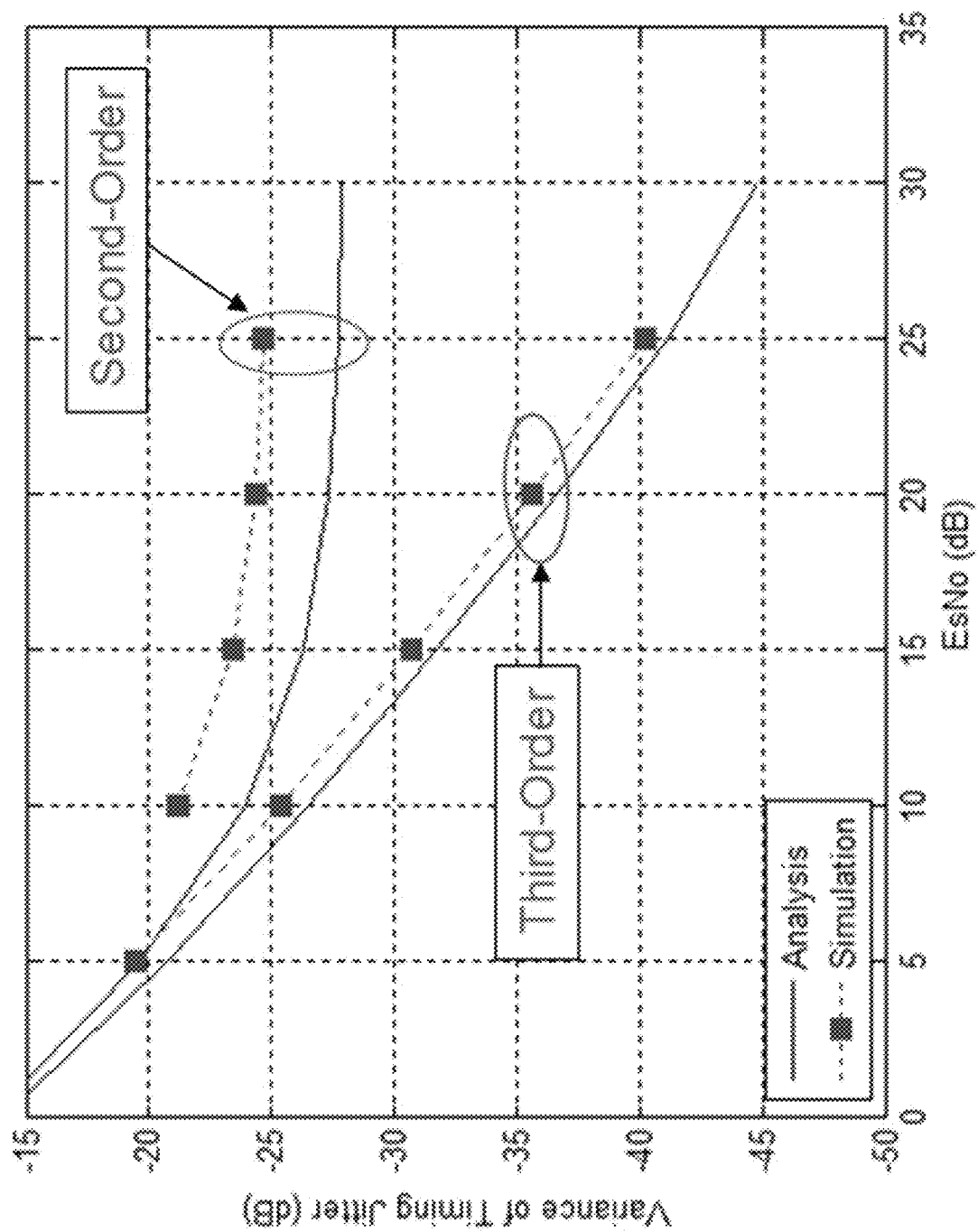
FIG. 15 is a plot illustrating analysis and simulation results of timing jitter variance due to nonlinear TED self-noise and AWGN as a function of per-symbol SNR, for a second-order loop versus a third-order loop in accordance with the disclosure, when the loop bandwidth is set at 0.1% of the symbol rate and using 32 APSK modulation and RRC filters with rolloff of 0.05.

FIG. 15 is a plot illustrating analysis and simulation results of timing jitter variance due to nonlinear TED self-noise and AWGN as a function of per-symbol SNR, for a second-order loop versus a third-order loop in accordance with the disclosure, when the loop bandwidth is set at 0.1% of the symbol rate and using 32 APSK modulation and RRC filters with rolloff of 0.05. As illustrated, the performance of the second-order loop exhibits a noise floor of −24.5 dB due to self-noise that it does not filter. In comparison, the third-order loop, which may filter out self-noise, does not suffer from an error floor, improving performance over the state-of-the-art second-order loop by 11.5 dB at per-symbol SNR of 20 dB. Additionally, FIG. 15 illustrates close agreement between the analysis and simulation results for the third-order loop.

Figure 16:
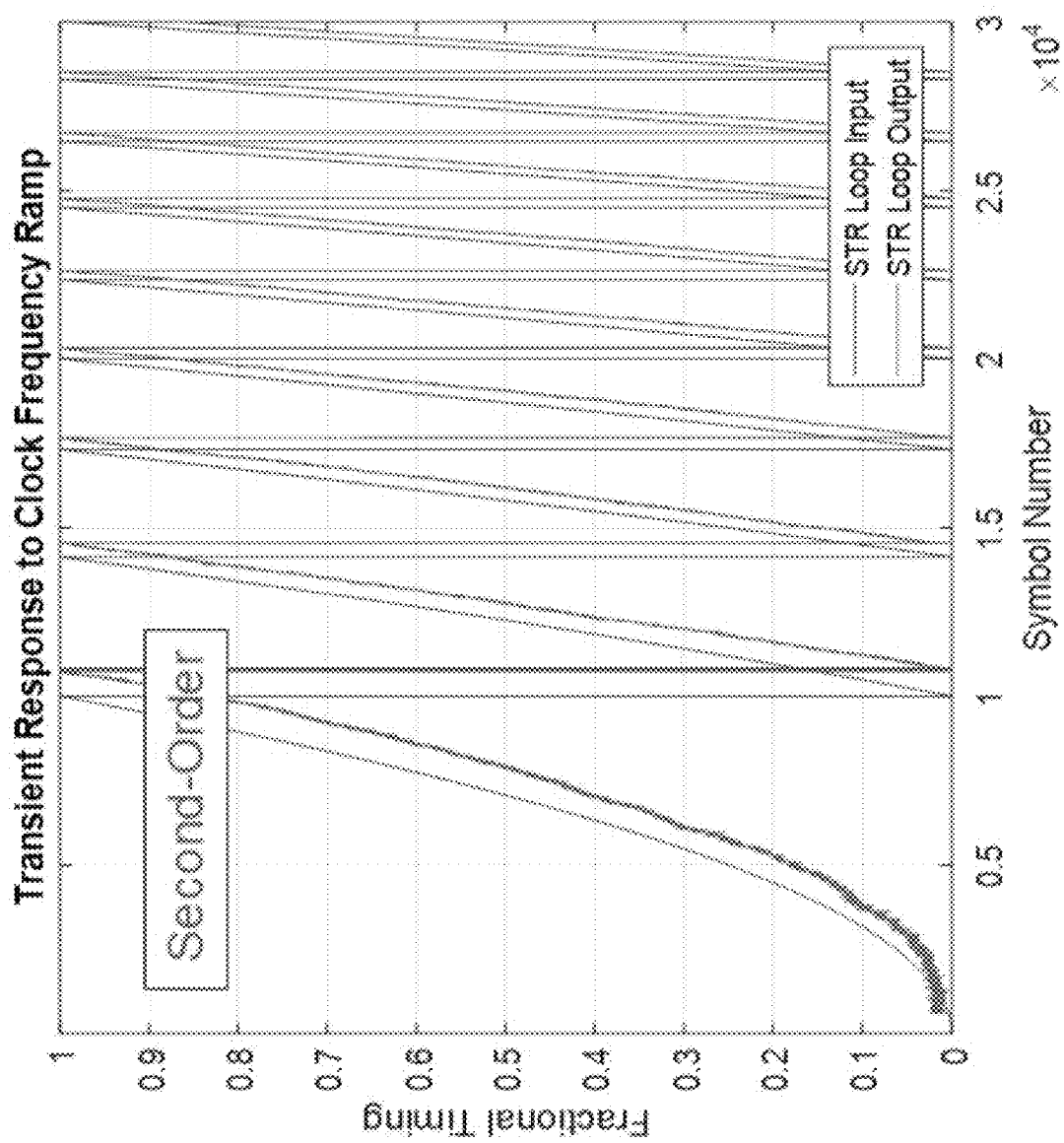
FIG. 16 is a plot illustrating simulation results of a transient response of a second order loop due to clock frequency-ramp, with 32 APSK modulation and RRC filters with rolloff of 0.05, when it is operated at a loop bandwidth of 0.02% of the symbol rate.
Figure 17:
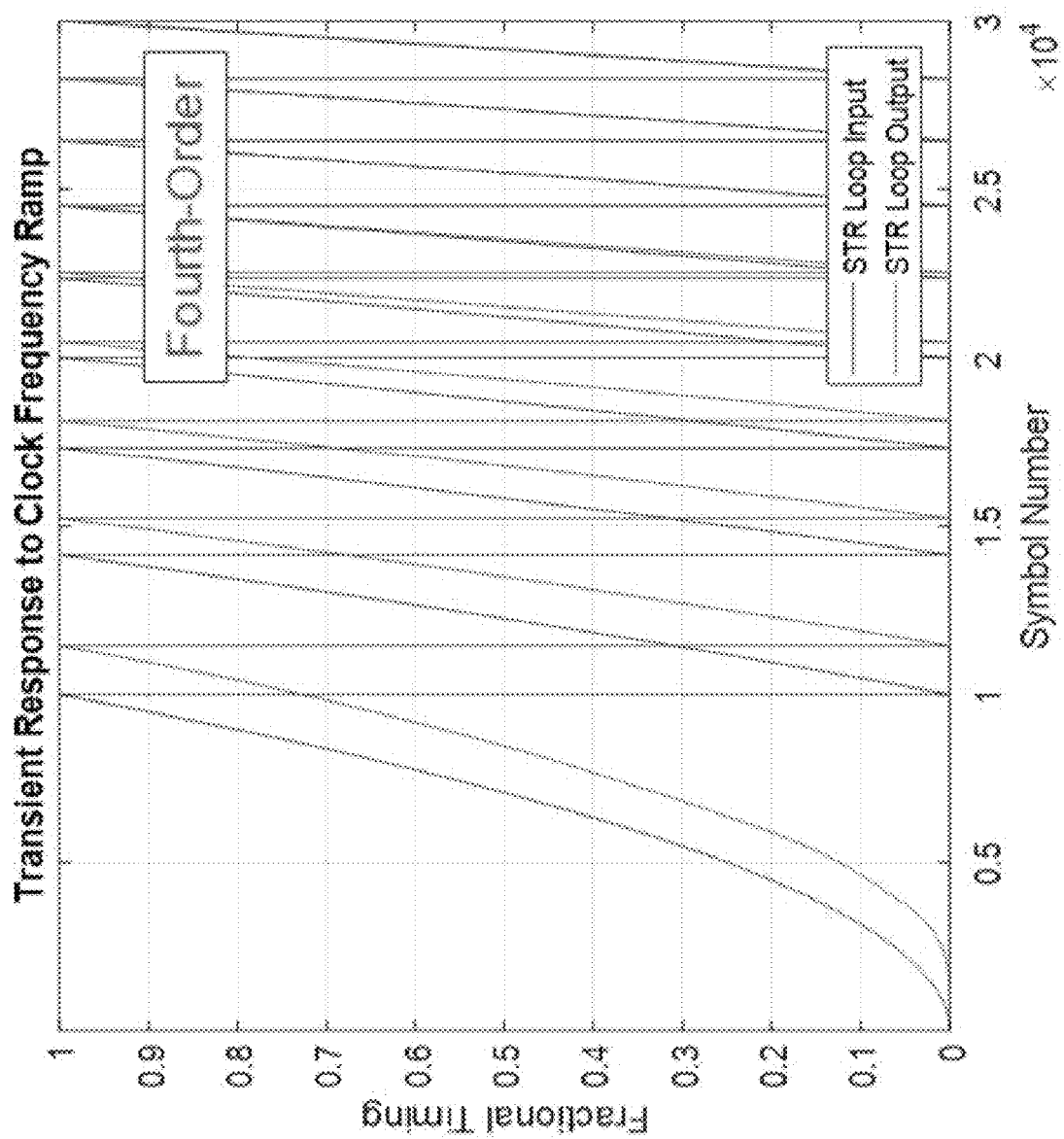
FIG. 17 is a plot illustrating simulation results of a transient response of a fourth order loop due to clock frequency-ramp, with 32 APSK modulation and RRC filters with rolloff of 0.05, when it is operated at a loop bandwidth of 0.02% of the symbol rate, in accordance with implementations of the disclosure.

FIGS. 16-17 are plots illustrating simulation results of transient responses due to clock frequency-ramp, for second-order (FIG. 16) and fourth-order (FIG. 17) loops with 32 APSK modulation and RRC filters with rolloff of 0.05, when the loops are operated at a bandwidth of 0.02% of the symbol rate. As depicted, the fourth-order loop can track the clock frequency-ramp with zero steady-state error. In comparison, the state-of-the-art second-order loop suffers from timing jitter and leaves an undesirable residual steady-state error.

Figure 18:
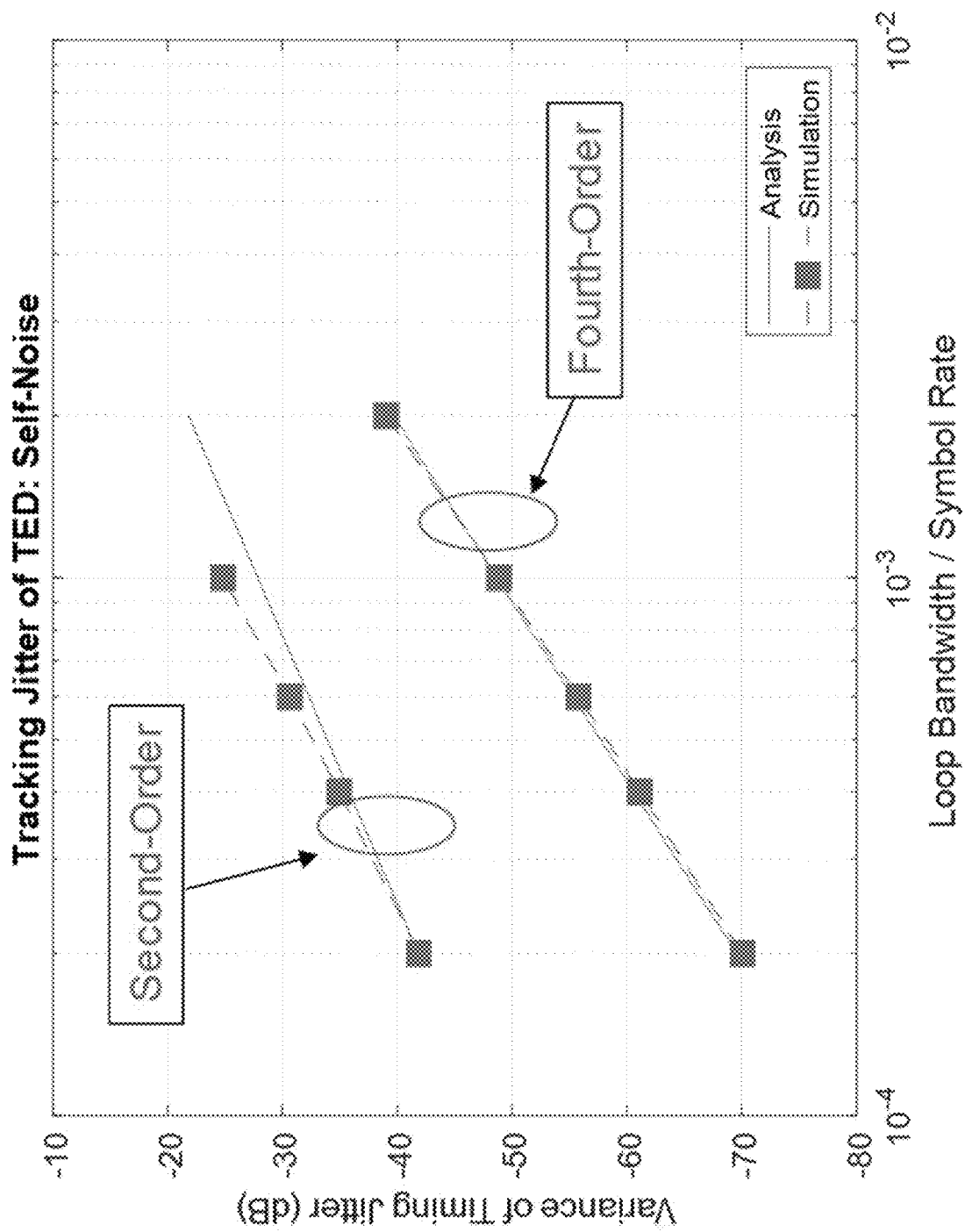
FIG. 18 is a plot illustrating analysis and simulation results of the timing jitter variance due to self-noise of a non-linear TED as a function of the loop bandwidth, for a second-order loop versus a fourth-order loop in accordance with the disclosure, when using 32 APSK modulation and RRC filters with rolloff of 0.05.

FIG. 18 is a plot illustrating analysis and simulation results of the timing jitter variance due to self-noise of a non-linear TED as a function of the loop bandwidth, for a second-order loop versus a fourth-order loop in accordance with the disclosure, when using 32 APSK modulation and RRC filters with rolloff of 0.05. As depicted, the fourth-order loop offers a large reduction in timing jitter from self-noise relative to its second-order counterpart: performance improvement of 30 dB at bandwidth of 0.02% of the symbol rate and 24 dB at bandwidth of 0.10% of the symbol rate. Additionally, FIG. 18 illustrates close agreement between the analysis and simulation results for the fourth-order loop. As the foregoing examples illustrate, both the third-order loop in FIG. 14 and the fourth-order loop in FIG. 18 achieve large performance improvements over second-order state-of-the-art loops when tackling self-noise.

It should be appreciated that although the foregoing examples of the closed-loop symbol-timing system were simulated using 32 APSK signal constellation and a matched pair of transmit/receive RRC filters with rolloff of 0.05, the timing synchronization technology described herein is not limited to communication systems having these parameters. Rather, the technology described herein may be applied using other signal constellations (e.g., 64 APSK, 128 APSK, 256 APSK, or other constellations), using other transmit and/or receive filters, and/or using mismatched transmit/receive filters. It is expected that the overall appearance and/or pattern of the foregoing results would be similar, although the levels may change. As such, it is anticipated that the use of loop filters configured to operate within a loop of third order or higher to handle the self-noise of a nonlinear TED (e.g., aggravated by spectrally efficient communication and/or asymmetric propagation channel filters) would be beneficial in implementations where other modulation schemes or receive filters are used.

Figure 19:
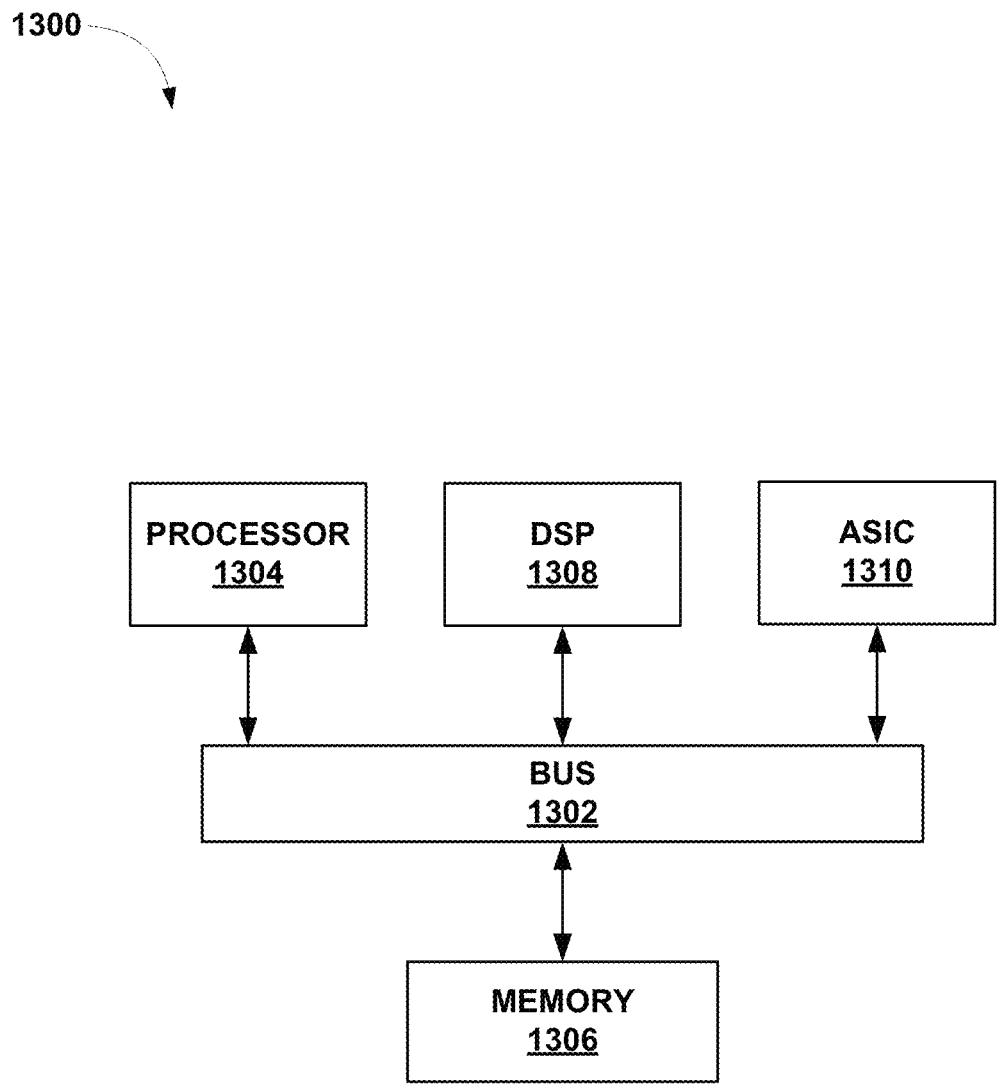
FIG. 19 illustrates a chip set in which embodiments of the disclosure may be implemented.

FIG. 19 illustrates a chip set 1300 in which embodiments of the disclosure may be implemented. Chip set 1300 can include, for instance, processor and memory components incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, chip set 1300 includes a communication mechanism such as a bus 1302 for passing information among the components of the chip set 1300. A processor 1304 has connectivity to bus 1302 to execute instructions and process information stored in a memory 1306. Processor 1304 includes one or more processing cores with each core configured to perform independently. A multi-core processor enables multiprocessing within a single physical package. Examples of a multi-core processor include two, four, eight, or greater numbers of processing cores. Alternatively or in addition, processor 1304 includes one or more microprocessors configured in tandem via bus 1302 to enable independent execution of instructions, pipelining, and multithreading. Processor 1304 may also be accompanied with one or more specialized components to perform certain processing functions and tasks such as one or more digital signal processors (DSP) 1308, and/or one or more application-specific integrated circuits (ASIC) 1310. DSP 1308 can typically be configured to process real-world signals (e.g., sound) in real time independently of processor 1304. Similarly, ASIC 1310 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

Processor 1304 and accompanying components have connectivity to the memory 1306 via bus 1302. Memory 1306 includes both dynamic memory (e.g., RAM) and static memory (e.g., ROM) for storing executable instructions that, when executed by processor 1304, DSP 1308, and/or ASIC 1310, perform the process of example embodiments as described herein. Memory 1306 also stores the data associated with or generated by the execution of the process.

In this document, the terms "machine readable medium," "computer readable medium," and similar terms are used to generally refer to non-transitory mediums, volatile or non-volatile, that store data and/or instructions that cause a machine to operate in a specific fashion. Common forms of machine readable media include, for example, a hard disk, solid state drive, magnetic tape, or any other magnetic data storage medium, an optical disc or any other optical data storage medium, any physical medium with patterns of holes, a RAM, a PROM, EPROM, a FLASH-EPROM, NVRAM, any other memory chip or cartridge, and networked versions of the same.

These and other various forms of computer readable media may be involved in carrying one or more sequences of one or more instructions to a processing device for execution. Such instructions embodied on the medium, are generally referred to as "instructions" or "code." Instructions may be grouped in the form of computer programs or other groupings. When executed, such instructions may enable a processing device to perform features or functions of the present application as discussed herein.

In this document, a "processing device" may be implemented as a single processor that performs processing operations or a combination of specialized and/or general-purpose processors that perform processing operations. A processing device may include a CPU, GPU, APU, DSP, FPGA, ASIC, SOC, and/or other processing circuitry.

The various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

Each of the processes, methods, and algorithms described in the preceding sections may be embodied in, and fully or partially automated by, code components executed by one or more computer systems or computer processors comprising computer hardware. The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. Additionally, unless the context dictates otherwise, the methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A symbol-timing tracking system for a receiver, comprising:
    an analog-to-digital converter (ADC) configured to generate a digital signal by sampling an analog signal received at the receiver;
    an interpolator configured to adjust a sampling rate of the digital signal;
    a receive filter configured to apply a receive filtering function to the digital signal to generate a filtered signal;
    a timing error detector (TED) configured to generate a timing error signal from the filtered signal;
    a loop filter of third order or higher, the loop filter configured to filter the timing error signal to remove self-noise present in the timing error signal and generate a filtered timing error signal; and a numerically controlled oscillator (NCO) configured to control timing data based on the filtered timing error signal and provide the timing data to the interpolator, wherein the interpolator is configured to correct for timing of the digital signal based on the timing data, and adjust the sampling rate of the digital signal based on the timing data.

2. The symbol-timing tracking system of claim 1, wherein the TED is nonlinear and generates the self-noise due to its nonlinearity, wherein the loop filter is configured to filter out the self-noise generated by the TED due to its nonlinearity.

3. The symbol-timing tracking system of claim 2, wherein the TED is not data-aided, wherein a carrier phase offset of the analog signal is unknown by the TED, and wherein the analog signal is shifted in time by an amount unknown by the TED.

4. The symbol-timing tracking system of claim 1, wherein the loop filter is configured to track higher order dynamics of a timing signal.

5. The symbol-timing tracking system of claim 4, wherein the higher order dynamics comprise a clock timing-ramp or a clock frequency-ramp.

6. The symbol-timing tracking system of claim 1, wherein the analog signal comprises complex-valued symbols drawn from a 32 APSK constellation, a 64 APSK constellation, a 128 APSK constellation, or a 256 APSK constellation.

7. The symbol-timing tracking system of claim 1, wherein the analog signal is shaped by a root raised-cosine (RRC) transmit filter, wherein the receive filter is matched to the RRC transmit filter.

8. The symbol-timing tracking system of claim 6, wherein the analog signal is shaped by a root raised-cosine (RRC) transmit filter, wherein the receive filter is matched to the RRC transmit filter.

9. The symbol-timing tracking system of claim 1, wherein the loop filter is an infinite impulse response (IIR) filter.

10. The symbol-timing tracking system of claim 9, wherein an output v[n] of the IIR filter is given by:

$$v[n] = \sum_{k=0}^{N_\beta} \beta_k \cdot u[n-k] - \sum_{k=1}^{N_\alpha} \alpha_k \cdot v[n-k],$$

where $N_\alpha$ and $N_\beta$ are orders of feedback and feedforward filtering operations of the IIR filter, respectively, $\alpha_k$ and $\beta_k$ are constants, and u[n] is an input of the IIR filter.

11. The symbol-timing tracking system of claim 9, wherein the IIR filter is configured with a loop of third-order or fourth-order.

12. A method, comprising:
sampling an analog signal received at a receiver to generate a digital signal;
adjusting, using an interpolator, a sampling rate of the digital signal;
applying a receive filtering function to the digital signal to generate a filtered signal;
generating, using a timing error detector (TED), a timing error signal from the filtered signal;
filtering, using a loop filter of third order or higher, the timing error signal to remove self-noise present in the timing error signal and generate a filtered timing error signal; and
controlling, using a numerically controlled oscillator (NCO), timing data based on the filtered timing error signal; and
providing the timing data to the interpolator, wherein the interpolator is configured to correct for timing of the digital signal based on the timing data, and adjust the sampling rate of the digital signal based on the timing data.

13. The method of claim 12, wherein the TED is nonlinear and generates the self-noise due to its nonlinearity, wherein filtering the timing error signal comprises filtering the self-noise generated by the TED due to its nonlinearity.

14. The method of claim 13, wherein the TED is not data-aided, wherein a carrier phase offset of the analog signal is unknown by the TED, and wherein the analog signal is shifted in time by an amount unknown by the TED.

15. The method of claim 12, wherein the loop filter is configured to track higher order dynamics of a timing signal, wherein the higher order dynamics comprise a clock timing-ramp or a clock frequency-ramp.

16. The method of claim 12, wherein the analog signal comprises complex-valued symbols drawn from a 32 APSK constellation, a 64 APSK constellation, a 128 APSK constellation, or a 256 APSK constellation, wherein the analog signal is shaped by a root raised-cosine (RRC) transmit filter, wherein the receive filter is matched to the RRC transmit filter.

17. The method of claim 12, wherein the loop filter is an infinite impulse response (IIR) filter, wherein an output v[n] of the IIR filter is given by:

$$v[n] = \sum_{k=0}^{N_\beta} \beta_k \cdot u[n-k] - \sum_{k=1}^{N_\alpha} \alpha_k \cdot v[n-k],$$

where $N_\alpha$ and $N_\beta$ are orders of feedback and feedforward filtering operations of the IIR filter, respectively, $\alpha_k$ and $\beta_k$ are constants, and u[n] is an input of the IIR filter.

18. A receiver, comprising:
circuitry configured to receive an analog signal from a wireless communication network; and
a symbol-timing tracking system, comprising:
an analog-to-digital converter (ADC) configured to generate a digital signal by sampling the analog signal;
an interpolator configured to adjust a sampling rate of the digital signal;
a receive filter configured to apply a receive filtering function to the digital signal to generate a filtered signal;
a timing error detector (TED) configured to generate a timing error signal from the filtered signal;
a loop filter of third order or higher, the loop filter configured to filter the timing error signal to remove self-noise present in the timing error signal and generate a filtered timing error signal; and
a numerically controlled oscillator (NCO) configured to control timing data based on the filtered timing error signal and provide the timing data to the interpolator, wherein the interpolator is configured to correct for timing of the digital signal based on the timing data, and adjust the sampling rate of the digital signal based on the timing data.

19. The receiver of claim 18, wherein the TED is nonlinear and generates the self-noise due to its nonlinearity, wherein the loop filter is configured to filter out self-noise generated by the TED due to its nonlinearity.

20. The receiver of claim 18, wherein the wireless communication network comprises a satellite communications network, wherein the circuitry is configured to receive the analog signal from a satellite transponder of the satellite communications network.

\* \* \* \* \*